United States Patent
Czmyrid et al.

(10) Patent No.: US 11,244,086 B2
(45) Date of Patent: *Feb. 8, 2022

(54) STONE SLAB PRODUCTION METHODS AND SYSTEMS

(71) Applicant: Cambria Company LLC, Eden Prairie, MN (US)

(72) Inventors: Christopher Charles Czmyrid, Santa Fe, NM (US); Benjamin William Davis, Elko, MN (US)

(73) Assignee: Cambria Company LLC, Eden Prairie, MN (US)

( * ) Notice: Subject to any disclaimer, the term of this patent is extended or adjusted under 35 U.S.C. 154(b) by 244 days.

This patent is subject to a terminal disclaimer.

(21) Appl. No.: 16/671,924

(22) Filed: Nov. 1, 2019

(65) Prior Publication Data

US 2020/0065435 A1    Feb. 27, 2020

Related U.S. Application Data

(63) Continuation of application No. 15/478,008, filed on Apr. 3, 2017, now Pat. No. 10,467,352.

(51) Int. Cl.
*G06F 30/13*    (2020.01)
*G06T 7/90*    (2017.01)
*G06F 16/51*   (2019.01)

(52) U.S. Cl.
CPC ............. *G06F 30/13* (2020.01); *G06F 16/51* (2019.01); *G06T 7/90* (2017.01); *Y02P 90/30* (2015.11)

(58) Field of Classification Search
CPC .......... G06F 16/51; G06F 30/13; Y02P 90/30; G06T 15/04
See application file for complete search history.

(56) References Cited

U.S. PATENT DOCUMENTS

| | | | |
|---|---|---|---|
| 178,308 A | 6/1876 | Leathers et al. |
| 1,212,331 A | 1/1917 | Denivelle |
| 1,474,817 A | 11/1923 | Fincke |
| 1,485,810 A | 3/1924 | Parker, Jr. et al. |
| 1,568,070 A | 1/1926 | Jennens |
| 1,570,538 A | 1/1926 | Thomas |
| 1,711,701 A | 5/1929 | Speck |
| 2,280,488 A | 4/1942 | Jenkins et al. |
| 3,013,370 A | 12/1961 | Vida |
| 3,164,647 A | 1/1965 | Fischler |

(Continued)

FOREIGN PATENT DOCUMENTS

| | | |
|---|---|---|
| CN | 102050598 | 5/2011 |
| EP | 0239143 | 9/1987 |

(Continued)

OTHER PUBLICATIONS

"Cambria introduces the new costal collection," [press release] Feb. 4, 2014, 2 pages.

(Continued)

*Primary Examiner* — Thai Q Phan
(74) *Attorney, Agent, or Firm* — Fish & Richardson P.C.

(57) ABSTRACT

This document describes systems and processes of manufacturing, visualizing, and distributing stone slabs. In an exemplary embodiment, a 3D scene may be generated that depicts a portion of a major surface of a stone slab at a target area of a slab installation environment.

20 Claims, 10 Drawing Sheets

(56) References Cited

U.S. PATENT DOCUMENTS

| | | | |
|---|---|---|---|
| 3,177,279 A | 4/1965 | Bilodeau | |
| 3,245,129 A | 4/1966 | Entz | |
| 3,245,648 A | 4/1966 | Johansson et al. | |
| 3,628,766 A | 12/1971 | Hartmann | |
| 3,670,060 A | 6/1972 | Cuffaro et al. | |
| 3,712,825 A | 1/1973 | Yocum | |
| 3,743,235 A | 7/1973 | Shelley | |
| 3,819,436 A | 6/1974 | Allen | |
| 3,843,089 A | 10/1974 | Scholz et al. | |
| 3,904,791 A | 9/1975 | Iverson et al. | |
| 4,094,941 A | 6/1978 | Manners et al. | |
| 4,128,357 A * | 12/1978 | Barth | E02B 3/14 |
| | | | 404/41 |
| 4,223,346 A | 9/1980 | Neiheisel et al. | |
| 4,254,077 A | 3/1981 | Fontana et al. | |
| 4,680,155 A | 7/1987 | Rochefort et al. | |
| 4,914,870 A | 4/1990 | Toncelli | |
| 5,022,193 A | 6/1991 | Toncelli | |
| 5,080,085 A | 1/1992 | Lovato | |
| 5,398,458 A | 3/1995 | Henriksen | |
| 5,662,847 A | 9/1997 | Uchida et al. | |
| 5,670,007 A | 9/1997 | Toncelli | |
| 5,679,298 A | 10/1997 | Uchida et al. | |
| 5,813,183 A | 9/1998 | Attley | |
| 5,986,670 A | 11/1999 | Dries et al. | |
| 6,205,727 B1 | 3/2001 | Toncelli | |
| 6,237,294 B1 | 5/2001 | Rygiel | |
| 6,461,552 B1 | 10/2002 | Geiger | |
| 6,535,294 B1 | 3/2003 | Arledge, Jr. et al. | |
| 6,572,802 B1 | 6/2003 | Austin | |
| 6,757,582 B2 | 6/2004 | Brisson et al. | |
| 6,811,860 B2 | 11/2004 | Kemp | |
| 7,056,120 B1 | 6/2006 | Bergman, Jr. | |
| 7,241,981 B2 | 7/2007 | Hofmann | |
| 7,565,221 B2 | 7/2009 | Fischer et al. | |
| 7,771,680 B2 | 8/2010 | Gordienko | |
| 7,806,029 B2 | 10/2010 | Rozot et al. | |
| 7,815,827 B2 | 10/2010 | Cruz | |
| 7,877,163 B2 | 1/2011 | Fischer et al. | |
| 7,909,241 B2 | 3/2011 | Stone et al. | |
| 8,030,441 B2 | 10/2011 | Toncelli | |
| 8,101,113 B2 | 1/2012 | Castonguay et al. | |
| 8,117,558 B2 | 2/2012 | Hognet | |
| 8,158,548 B2 | 4/2012 | Di Noto et al. | |
| 8,333,916 B2 | 12/2012 | Jamrussamee et al. | |
| 8,398,954 B2 | 3/2013 | Gordienko | |
| 8,402,868 B2 | 3/2013 | Rozot et al. | |
| 8,636,941 B1 | 1/2014 | Ciuperca | |
| 8,743,137 B2 | 6/2014 | Peters et al. | |
| 9,019,266 B2 | 4/2015 | Hoguet | |
| 9,047,520 B2 | 6/2015 | Honeck et al. | |
| 9,186,819 B1 | 11/2015 | Grzeskowiak, II | |
| 9,530,250 B2 | 12/2016 | Mazula | |
| 9,613,412 B1 * | 4/2017 | Olson | G06F 16/51 |
| 2002/0093538 A1 | 7/2002 | Carlin | |
| 2003/0157273 A1 | 8/2003 | Kemp | |
| 2004/0032044 A1 | 2/2004 | Toncelli | |
| 2004/0236634 A1 | 11/2004 | Ruuttu | |
| 2005/0004783 A1 | 1/2005 | Carey | |
| 2005/0013991 A1 | 1/2005 | Yang | |
| 2005/0081161 A1 | 4/2005 | MacInnes et al. | |
| 2005/0199111 A1 | 9/2005 | Sandberg et al. | |
| 2005/0238856 A1 | 10/2005 | Zanzuri | |
| 2006/0016957 A1 | 1/2006 | Hofmann | |
| 2006/0053742 A1 * | 3/2006 | Hayden | E04F 15/08 |
| | | | 52/747.12 |
| 2006/0204682 A1 | 9/2006 | Yang | |
| 2006/0221417 A1 | 10/2006 | Fujieda et al. | |
| 2007/0216058 A1 | 9/2007 | Carreras-Maldonado et al. | |
| 2007/0241013 A1 | 10/2007 | Alpert et al. | |
| 2007/0282718 A1 | 12/2007 | Morgan et al. | |
| 2008/0070198 A1 | 3/2008 | Dempsey | |
| 2008/0113123 A1 | 5/2008 | Izzo | |
| 2008/0153688 A1 | 6/2008 | Borens et al. | |
| 2009/0024628 A1 | 1/2009 | Angel et al. | |
| 2009/0070238 A1 | 3/2009 | Moryto | |
| 2009/0070273 A1 | 3/2009 | Moryto | |
| 2010/0159220 A1 | 6/2010 | Toncelli | |
| 2010/0194005 A1 | 8/2010 | Toncelli | |
| 2010/0211421 A1 | 8/2010 | Sciammarella et al. | |
| 2010/0289817 A1 | 11/2010 | Meier et al. | |
| 2011/0034586 A1 | 2/2011 | Buskila et al. | |
| 2011/0166954 A1 | 7/2011 | Stone et al. | |
| 2011/0283859 A1 | 11/2011 | Codemo | |
| 2012/0003453 A1 | 1/2012 | Buskila et al. | |
| 2012/0170840 A1 | 7/2012 | Caruso et al. | |
| 2012/0183735 A1 | 7/2012 | Moreno et al. | |
| 2012/0231424 A1 | 9/2012 | Calman et al. | |
| 2013/0130036 A1 | 5/2013 | Bettiol et al. | |
| 2013/0196251 A1 | 8/2013 | Di Noto et al. | |
| 2013/0245156 A1 | 9/2013 | Buskila et al. | |
| 2013/0262344 A1 | 10/2013 | Ritota et al. | |
| 2015/0161695 A1 | 6/2015 | Koby et al. | |
| 2015/0187136 A1 | 7/2015 | Grimaud | |
| 2015/0304456 A1 | 10/2015 | Karthikeyan et al. | |
| 2016/0179342 A1 | 6/2016 | Sarao et al. | |
| 2017/0186149 A1 * | 6/2017 | Olson | G06T 7/0004 |
| 2018/0285481 A1 * | 10/2018 | Czmyrid | G06T 15/04 |

FOREIGN PATENT DOCUMENTS

| | | |
|---|---|---|
| WO | WO 1994028397 | 12/1994 |
| WO | WO 2006100706 | 9/2006 |
| WO | WO 2007080059 | 7/2007 |
| WO | WO 2008015596 | 2/2008 |
| WO | WO 2009010406 | 1/2009 |
| WO | WO 2015134794 | 9/2015 |

OTHER PUBLICATIONS

Bacasystems.com' [online] "Baca Systems," Feb. 27, 2017 [retrieved on Jun. 3, 2018] Retrieved from Internet: URL<https://web.archive.org/web/20170227023158/https://bacasystems.com/granitestudio/> 2 pages.

canvas.io' [online] "Mobile 3D Scanning." Available on or before Jan. 1, 2017, [retrieved on Jan. 23, 2017] Retrieved from Internet URL< https://canvas.io> via the Wayback Internet Archive at URL<https://web.archive.org/web/20170101090150/https://canvas.io/> 3 pages.

International Search Report and Written Opinion issued in International Application No. PCT/US2018/025799, dated Jun. 29, 2018, 17 pages.

smartpicture3d.com' [online] "SmartPciture: Create accurate models and measurements of any room, window, or door," abailable on or before Jul. 5, 2014, [retrieved on Jan. 23, 2017] Retrieved from Internet: URL<wttp://smartpicture3d.com> via the Wayback Internet Archive at URL<https://web.archive.org/web/20141224173122/http://smartpicture3d.com/ > 6 pages.

www.breton.it [online] "Bretonstone Slabs—Plants for manugacturing engineered stone slabs and tiles," Available on or before Jan. 11, 2014 via the Wayback Internet Archive [retrieved on Apr. 28, 2016] Retrieved from Internet: URL<http://web.archive.org/web/20100111015935/http:/www.breton.it/engineerdstone/en/product/Plants_for_manufacturing_compound_stone/bretonstone%c2%ae_slabs> 4 pages.

www.chameleonpower.com' [online] "Unique Stone's Visualizer," Available on or before Jan. 2017, [retrieved on Jan. 23, 2017] Retrieved from Internet: URL<http://www.chameleonpower.com/latest.aspx> 3 [shrd.

www.holoplex.com' [online] "The hottest way to pre-sell real estate," Available on or before Jul. 17, 2015, [retrieved on Jan. 23, 2017] Retreived from Internet URL<http://www.holoplex.com> 20 pages.

www.homestyler.com' [online] "AutoDesk Homestyler App," Copyright 2015, Available on or before Dec. 24, 2016, [retrieved on Jan. 23, 2017] Retrieved from Internet: URL<http://www.homestyler.com/mobile> via the Wayback Internet Archive at URL<http://web.archive.org/web/20161224091858/https://www.homestyler.com/mobile> 2 pages.

(56) References Cited

OTHER PUBLICATIONS www.interiorvista.com' [online] "All-in-one solutions," first available on or before Oct. 25, 2015, [retrieved on Mar. 19, 2018] Retrieved from Internet: URL<https://www.interiorvista.com/solutions/> 5 pages.

www.mapastone.com' [online]"Mapascan," Powerpoint presentation, Sep. 2012, [retrieved on Jan. 23, 2017] Retrieved from Internet: URL<http://www.mapastone.com/wp-content/uploads/2012/09/depliant-mapascan-2012.pdf>16 pages.

www.slabsmith.com' [online] "Slabsmith on the Polishing Line," Northwoods Design, Inc. Copyright 2012, [retrieved on Jan. 23, 2017] Retrieved from Internet: URL<http://www.slabsmith.com/Manufacturer/Overyiew> 3 pages.

\* cited by examiner

STONE SLAB PRODUCTION METHODS AND SYSTEMS

CROSS-REFERENCE TO RELATED APPLICATIONS

This application is a continuation application of and claims priority to U.S. application Ser. No. 15/478,008, filed on Apr. 3, 2017.

TECHNICAL FIELD

This document describes processes and systems for manufacturing, visualizing, and distributing building materials in conjunction with, for example, a digital image representation of the building material.

BACKGROUND

Stone slabs are a commonly used building material. Granite, marble, soapstone, and other quarried stones are often selected for use as countertops, tables and floors. Stone slabs may also be formed from a combination of natural and other materials that can provide improved qualities such as aesthetic characteristics, reproducibility, and stain-resistant or heat-resistant properties. Stone slabs are typically cut to a desired size and shape prior to installation.

Digital representations of stone slabs may be used to facilitate or automate slab selection and cutting. For example, digital representations of stone slabs have been used to facilitate selection of stone slab styles, colors, etc. by a customer, such as by viewing a digital representation of a stone slab style.

SUMMARY

Some embodiments described herein include systems and methods of manufacturing, distributing, and/or visualizing surfaces, such as stone slab surface (e.g. quarried stone slabs, processed stone slabs, tiles, such as porcelain or ceramic tiles, partial stone slabs, etc.), wall coverings, paneling, flooring, veneers, architectural finishes, building material surfaces, and other surfaces. For example, building materials may include stone slabs suitable for use in living or working spaces (e.g., along a countertop, table, floor, reception area, or the like). Exemplary systems and methods may include generating an image and metadata related to a surface (e.g. building material surface) that can be used in subsequent visualization, fabrication, installation, quality assurance, or other activities. The image and associated metadata may facilitate realistic visualization of a particular building material without requiring significant physical manipulation, thereby improving selection, fabrication, and installation processes. Alternatively or additionally, some embodiments described herein improve performance and speed of a visualization system, while reducing the processing burden of server and client applications and/or latency time in communications between server and client applications.

Particular embodiments described herein include a system for producing stone slabs. The system includes a production database stored at a server system and including slab image files corresponding to a physical inventory of stone slabs. Optionally, each slab image file may be associated with only a single stone slab in the physical inventory and include an image of a major surface of the single stone slab. The server system includes software programmed to receive a slab image file from the production database and an environment image of a slab installation environment. Optionally, the server system is further programmed to determine a geometry of a target area of the slab installation environment, and generate a scene depicting at least a portion of the major surface of the stone slab associated with the slab image file at the target area in the slab installation environment. The server system optionally includes a network communication device to transfer the scene to a client application for display of the scene at a client device. The target area may have a different geometry than the major surface of the stone slab.

In some implementations, the system can optionally include one or more of the following features. Each slab image file may graphically represent a major surface of a corresponding stone slab in the inventory of stone slabs, and each slab image file may include image metadata including an identifier that uniquely identifies the corresponding stone slab, and at least one dimensional characteristic of the corresponding stone slab. The image of the major surface of the single stone slab may have an image length and an image width, the single stone slab may have a stone slab length and a stone slab width, and the dimensional characteristic stored as image metadata may include a numeric ratio of the stone slab length to the image length ($L_{slab}/L_{image}$). The 3D scene may include all or one or more portions of the major surface of the stone slab without repeating any portion of the major surface of the stone slab. The slab image file may be generated at a stone slab manufacturing site. The client application may be configured to receive user inputs to customize characteristics of the stone slab in the 3D scene. The customized characteristics may be selected from the group consisting of edge style, stone slab orientation, and stone slab position. The inventory of stone slabs may include processed stone slabs. The processed stone slabs may include predominantly quartz. The inventory of stone slabs may include quarried stone slabs.

Some embodiments described herein include a method for producing stone slabs, including storing slab image files at a production database of a server system, the slab image files corresponding to a physical inventory of stone slabs, each slab image file associated with only a single stone slab in the physical inventory and including an image of a major surface of the single stone slab, receiving a slab image file from the production database and an environment image of a slab installation environment, determining a geometry of a target area of the slab installation environment, generating a 3D scene depicting at least a portion of the major surface of the stone slab associated with the slab image file at the target area in the slab installation environment, and transferring the 3D scene to a client application for display of the 3D scene at a client device. The target area may have a different geometry than the major surface of the stone slab.

In some implementations, the method can optionally include one or more of the following features. Each slab image file may graphically represent a major surface of a corresponding stone slab in the inventory of stone slabs, each slab image file may include image metadata including an identifier that uniquely identifies the corresponding stone slab, and at least one dimensional characteristic of the corresponding stone slab. The image of the major surface of the single stone slab may have an image length and an image width, the single stone slab may have a stone slab length and a stone slab width, and the dimensional characteristic stored as image metadata may include a numeric ratio of the stone slab length to the image length ($L_{slab}/L_{image}$). The 3D scene may include all or one or more portions of the major surface of the stone slab without repeating any portion of the major surface of the stone slab. The slab image files may be generated at a stone slab manufacturing site. The client application may be configured to receive user inputs to customize characteristics of the stone slab in the 3D scene. The customized characteristics may be selected from the group consisting of edge style, stone slab orientation, and stone slab position. The inventory of stone slabs may include processed stone slabs. The inventory of stone slabs may include quarried stone slabs.

Some embodiments described herein include a method for producing stone slabs, including receiving a slab image file and an environment image of a slab installation environment, generating a 3D scene depicting at least a portion of the major surface of the stone slab associated with the slab image file at the target area in the slab installation environment, and transferring the 3D scene to a client application for display of the 3D scene at a client device.

The systems and techniques described herein may provide one or more of the following advantages. First, some embodiments described herein include a system that can reduce costs and improve efficiency associated with generating and displaying a visualization, such as visualization to assist a user selecting between various stone slabs. Alternatively or additionally, some embodiments can reduce costs and improve efficiency in quality control, distribution, fabrication/stone cutting, and other processes. Optionally, the system can generate and store digital images along with a set of additionally useful data as stone slabs or other materials move through an existing manufacturing line without a significant impact on the equipment and handling of the stone slabs or other materials. In another example, the system can generate and store digital images for subsequent use in visualization, quality control activities, matching or grouping of multiple stone slabs or other materials for shipment and/or use together, nesting or layout design activities by a fabricator, and/or other activities throughout the life of the stone slab or other materials.

Second, in some embodiments described herein, a particular stone slab or other material and a corresponding image (optionally, with embedded metadata for the particular slab or other material) may improve selection and/or purchasing processes by providing a realistic visualization consistent with the appearance of the associated stone slab or other material when installed in an installation environment. For example, a visualization process depicting a stone slab in a slab installation environment improves the customer selection process by facilitating visualization of a stone slab in an actual installation environment (e.g. such as the environment where the stone slab is to be installed instead of a showroom). Alternatively or additionally, a visualization including specific stone slab(s) available for purchase may facilitate visualization of a specific stone slab so that the customer can visualize the appearance of the actual physical stone before it is delivered or installed in the installation environment. Accordingly, in some embodiments, visualizations described herein may improve the overall customer satisfaction with the selection process and the final stone slab or other material installed in the installation environment.

Third, some embodiments described herein may facilitate visualization of how different design elements of an installation environment appear together (e.g. in combination in a single installation environment). For example, various surfaces or features of an installation environment may be visualized together to facilitate selection of a surface or feature, such as a stone slab, that is suitable for use in the installation environment with one or more other surfaces or features. One or more elements may be efficiently modified or changed to quickly arrive at a selected combination of surfaces and features or an installation environment. In some embodiments, visualizations described herein may facilitate a shortened timeframe for a user to select one or more surfaces, features, or combinations thereof.

Fourth, in some embodiments described herein, a processing burden associated with generating and displaying a visualization depicting a stone slab may be reduced. For example, a server system may be configured and programmed to perform much or all processing so as to reduce the processing burden on a client device. Alternatively or additionally, in some embodiments, communication speed between a server and client application may be increased, and latency time reduced, such that communication reliability and/or a user experience is improved.

Fifth, in some embodiments described herein, multiple operations related to stone slab manufacturing, distribution, and/or production may be eliminated or performed in parallel, reducing the complexity of delivering and installing a stone slab in an installation environment. For example, in some embodiments, a stone slab fabrication or nesting operation, including steps of measuring an installation environment and generating a slab layout to fit the installation environment, may be performed at least partially together with steps related to a visualization operation. Generating a scene depicting a particular stone slab in the installation environment may include steps of creating a layout of slab portions in the installation environment that has a high level of dimensional accuracy such that the layout can be used when cutting the physical stone slab for installation. The resulting layout can thus be used in both visualization operations and in subsequent nesting operations of the physical stone slab.

Sixth, in some embodiments described herein, generating a 3D scene depicting at least a portion of a stone slab in a slab installation environment allows a user to view multiple stone slabs in rapid succession without manipulation of a physical stone slab. A user may manipulate the visualization to view (e.g. in real-time) a variety of stone slab styles, specific stone slabs, layouts/orientations for slabs, colors, edge profiles, etc., while reducing physical manipulation of physical stone slabs, stone slab samples, or paper representations that may require additional physical manipulation and additional time and/or cost to generate. In some exemplary embodiments described herein, a user may view multiple stone slabs in rapid succession that have the same style, color type, edge profile, etc., in order to select a particular stone slab from an inventory of stone slabs having similar characteristics.

Seventh, in some embodiments, generating a scene depicting at least a portion of a stone slab in a slab installation environment may facilitate accurate cost quoting. The dimensionally accurate layout, and set of stone slab characteristics identified in a visualization operation (e.g. edge profile), facilitates calculation of an accurate cost quote. In some embodiments, a quote may be generated that is associated with a particular stone slab stored in inventory (e.g. rather than related generally to a stone slab style), further enhancing the reliability of the cost quote.

Eighth, in some embodiments, a precise dimensional relationship between a stone slab and an associated image can facilitate reliable visualization and nesting operations and may reduce manual measurement or other manipulation of the physical stone slab. Multiple visualization, nesting and cutting operations of a single slab may be carried out using a single image (e.g. generated at a time of manufacture), providing benefits in inventory management and other operations even after a portion of the stone slab has been cut or removed for a particular project. The image may be used to identify or match the remaining slab portion without requiring physical handling or additional imaging of the remaining slab portion.

Ninth, some embodiments described herein include a system that generates image metadata associated with a stone slab that provides information which may optionally allow an inventory of numerous stone slabs to be readily searched and cataloged without physically handling or moving the actual stone slabs. Additionally, one or more image characteristics stored as part of the image metadata may be used to group stone slabs for a particular customer or project, or to identify a particular slab from an inventory of stone slabs for a particular customer or project. Accordingly, a database including slab image files associated with a physical inventory of stone slabs facilitates automation of such tasks and enhances reliability in matching and selecting of a stone slab having desired characteristics, such as in selecting a particular stone slab for use in generating a visualization of the stone slab in an installation environment.

The details of one or more implementations are set forth in the accompanying drawings and the description below. Other features and advantages will be apparent from the description and drawings, and from the claims.

DETAILED DESCRIPTION OF ILLUSTRATIVE EMBODIMENTS

Figure 1:
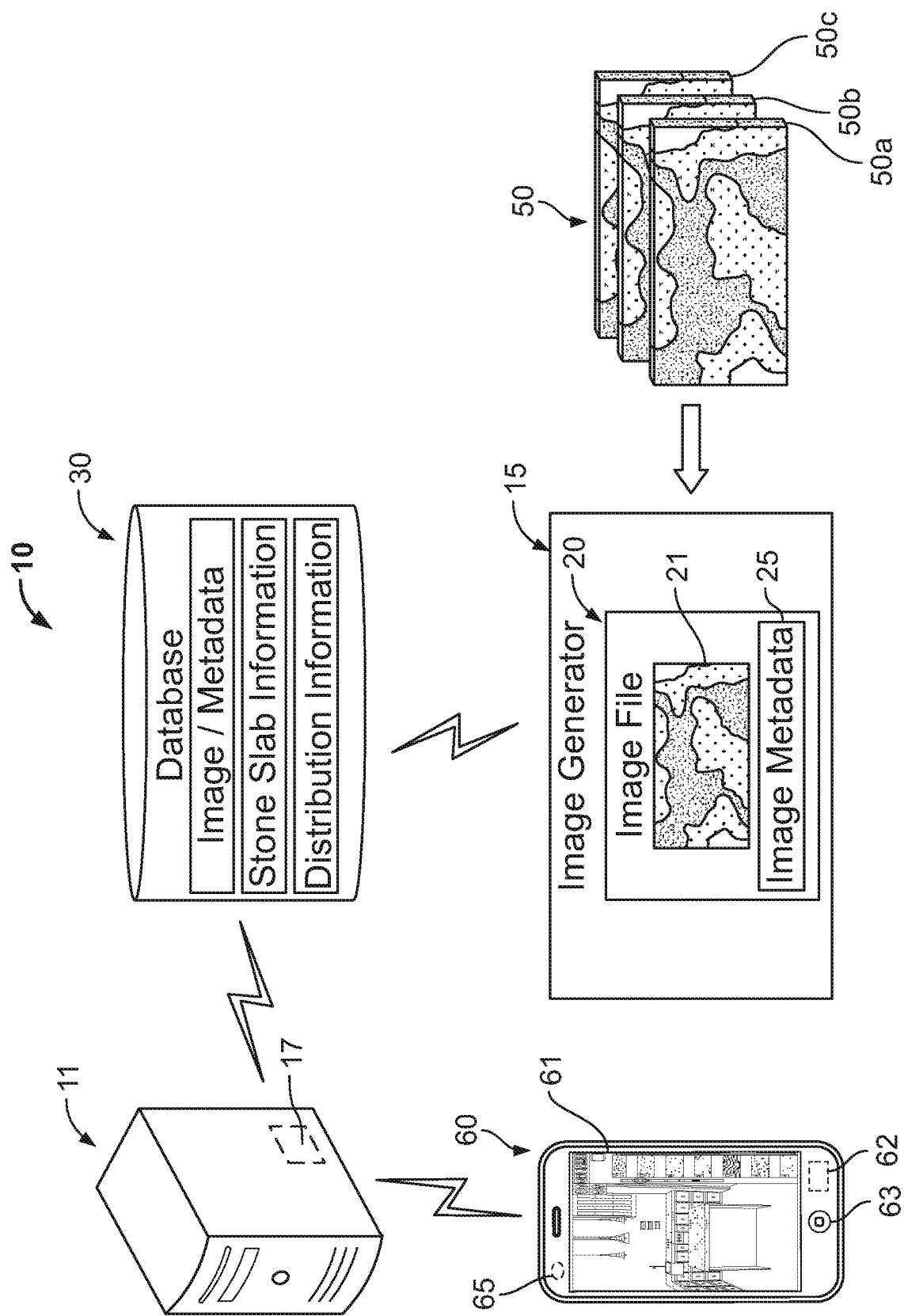
FIG. 1 is a diagram of an exemplary system used in manufacturing, visualizing, and distributing a stone slab in conjunction with, for example, a digital image representation of the stone slab.

Referring to FIG. 1, an exemplary stone slab post-production system 10 is shown that can be used to facilitate various operations related to a physical inventory of stone slabs 50. System 10 includes a server system 11, production database 30, and client device 60 that are in communication with one another to exchange information related to the physical inventory of stone slabs 50, stone slabs 50, and/or an installation environment where one or more stone slabs 50a, 50b, 50c (e.g. stone slabs or portions of stone slabs) of the physical inventory of stone slabs 50 may be installed. Server system 11 and/or client device 60 includes software programmed to generate a scene depicting at least a portion of a stone slab from the physical inventory of stone slabs 50. In some embodiments, server system 11 may be configured to receive an environment image of a slab installation environment (e.g. from client device 60) and generate a scene depicting at least a portion of the stone slab in the slab installation environment. Accordingly, some embodiments of system 10 facilitate visualization of a stone slab, available in a physical inventory of stone slabs 50, in a slab installation environment. System 15 and/or client device 60 can generate a realistic visualization of one or more physical stone slabs 50a, 50b, 50c that facilitates customer selection, cost quoting, and/or subsequent fabrication operations, such as fabrication and/or installation of countertops, floors, work surfaces, etc.

Production database 30 stores information related to system 10, including slab image files 20 associated with physical stone slabs 50a, 50b, 50c in the physical inventory of stone slabs 50. Production database 30 may include a data storage system made up of one or more repositories that store information related to system 10, and/or that may be stored at server system 11. Production database 30 may include one or more local databases, for example housed locally at a manufacturing location, and/or may include one or more remote databases. In an exemplary embodiment, production database 30 includes a cloud-based system that may be accessed remotely, and access to various components of production database 30 may be selectively granted to particular users. A manufacturer and/or system administrator may have complete access to all aspects of production database 30, while a remote party may be granted access only to particular content, such as particular slab image files 20 that a remote party has purchased or is considering purchasing, for example.

In addition to slab image files 20, production database 30 may store other stone slab information 32 and/or distribution information 33. Such information may similarly be used for one or more operations related to stone slabs 50 and/or selectively distributed to one or more users.

Slab image files 20 may be generated at an image generator station 15. Image generator station 15 may operate to generate slab images at a location where stone slabs 50 are manufactured and/or stored. For example, image generator station 15 may generate slab images as part of an existing manufacturing line, such as after a polishing operation of a slab manufacturing line. Alternatively, image generator station 15 may operate to generate slab images at a location remote from an initial manufacturing location. For example, image generator station 15 may generate slab images as part at a fabrication location, such as a location where stone slabs are cut for installation in a desired application, (e.g. after being shipped from a location of initial manufacture), or at a distribution center or warehouse (e.g. after being shipped from a location of initial manufacture).

In an exemplary embodiment, slab image files 20 include a digital image 21 of an associated stone slab, and/or information related to the stone slab stored as image metadata 25, such as a unique identifier, manufacturing location and/or date/time, dimensional relationship(s), thickness, gloss readings, color characteristics, purchaser information, processing conditions, genealogy, etc. Some data, such as the unique identifier, manufacturing location and/or date/time, dimensional relationship(s), thickness, gloss readings, color characteristics, etc. may be stored as read-only data. Other information, such as a purchaser information and/or other information may be readily updateable throughout the life of slab image file 20, and may be selectable such that certain metadata may be included and/or viewable only by a particular user.

Server system 11 includes software programmed to perform various tasks associated with the physical inventory of stone slabs 50. Server system 11 may include software programmed to receive and manipulate slab image files 20 and/or slab environment images (e.g. captured and/or received from client device 60), and/or combine at least some aspects of the images to generate a scene depicting a slab in an installation environment. Server system 11 includes one or more network communication devices 17 that provide communication between production database 30 and/or client device 60, and facilitate transfer of slab image files 20, slab environment images, and/or other data.

Client device 60 includes a user interface display 61, network communication device 62, one or more inputs 63 for user commands, and a client application. Client device 60 is a device configured to receive information related to one or more stone slabs in the physical inventory of stone slabs 50 from server system 11. In various exemplary embodiments, client device 60 may be a consumer device, such as a consumer computing device, and/or may include a smartphone, personal digital assistance, tablet computing device, laptop computing device, desktop computing device, or the like. User interface display 61 may deliver visual output to a user related to the physical inventory of stone slabs 50, such as a scene depicting a stone slab in an installation environment. In various exemplary embodiments, user interface display 61 may include a touch screen, projector, virtual reality simulator, 3D display, or the like. Network communication device 62 facilitates transfer of data to and from server system 11, such as a cellular, WLAN, short-wavelength UHF, or optical communication device, or the like. In an exemplary embodiment, client device 60 includes a camera or image capturing device 65 configured to capture a digital representation of a slab installation environment. Image capturing device 65 may be an integral component of client device 60, such as a rear-facing camera. Alternatively or additionally, image capturing device 65 may be removably attachable with other portions of client device 60, and/or separate from other portions of client device 60 (e.g. such that images captured by image capturing device 65 are subsequently transmitted to client device 60). In various embodiments, image capturing device 65 may include a visible light camera, infrared camera 3D scanning device, time-of-flight camera, structured light scanner, stereoscopic scanner, and the like. Alternately or in addition, pre-loaded images of installation environments may be selected and used in a visualization operation.

Server system 11 may be configured to depict a stone slab from the physical inventory of stone slabs 50 in a slab installation environment. In an exemplary embodiment, server system 11 is programmed to receive a slab image file 20, including a slab image 21 and slab image metadata 25 associated with a particular stone slab in the physical inventory of stone slabs 50, and/or an environment image of a slab installation environment. The slab image file and/or environment image may be received from production database 30 stored at server system 11, a remote production database 30, client device 60, or another repository of slab image files or environment images. In some embodiments, a user may transmit one or more environment images of the installation environment from client device 60 (e.g. by capturing an environment device via image capturing device 65 and transmitting the image from client device 60 to server system 11).

Server system 11 and/or client device 60 may include software programmed to identify geometry of a target area of the slab installation environment where portions of the slab may be installed, and subsequently divide the slab image into slab image portions fitted to the target area. The slab image portions may be combined with the environment image at the target areas to generate a scene depicting the slab image portions in the installation environment. The generated scene may then be displayed by a client application of client device 60. In various exemplary embodiments, the generated scene may be a 2D scene, 3D scene, or virtual reality environment that provides a visualization of one or more surfaces of an installation environment. In this way, system 10 can provide accurate and efficient visualizations of a stone slab in an installation environment that facilitates purchasing decisions, cost quoting, and/or subsequent fabrication operations of the physical stone slab (e.g. mapping and cutting the physical stone slab for installation).

In various exemplary embodiments, software programmed to perform various tasks associated with the physical inventory of stone slabs 50, visualization of an installation environment, and other tasks, may be performed anywhere on system 10. For example, software programmed to received and manipulate slab image files 20 and/or slab environment images, and/or combine at least some aspects of the images to generate a scene depicting a slab in an installation environment, may be stored and executed on server system 11, client device 60, and/or other component of system 10. Alternatively or additionally, software programmed to depict a stone slab from the inventory of stone slabs 50 in an installation environment, identify geometry of a target area of an installation environment where portions of the slab may be installed, and/or divide the slab image into slab image portions fitted to the target area, may be stored and executed on server system 11, client device 60, and/or other component of system 10.

The inventory of stone slabs 50 may include one or more types of stone slabs, including quarried stone slabs, processed stone slabs, tiles, such as porcelain or ceramic tiles, partial stone slabs, and the like. In various embodiments, stone slabs 50 may be suitable for installation at one or more surfaces or locations of an installation environment, including as a countertop, backsplash, flooring, wall covering, cabinet facing, veneer, pillar, fireplace surround, or other surfaces of an installation environment. Alternatively or additionally, system 10 can be used to facilitate various operations related to a physical inventory of any building materials or surfaces, such as countertops, backsplashes, flooring, wall coverings, cabinet facings, veneers, pillars, fireplace surrounds, or other surfaces.

Figure 2:
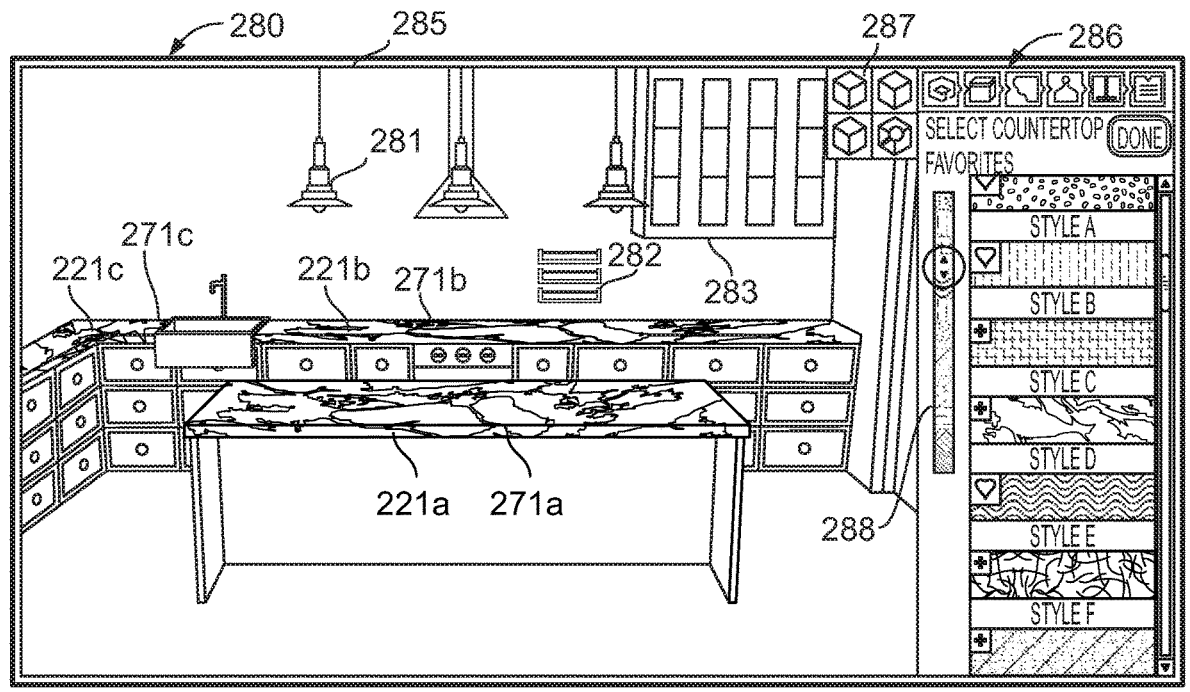
FIG. 2 shows a user interface of a client application.
Figure 3:
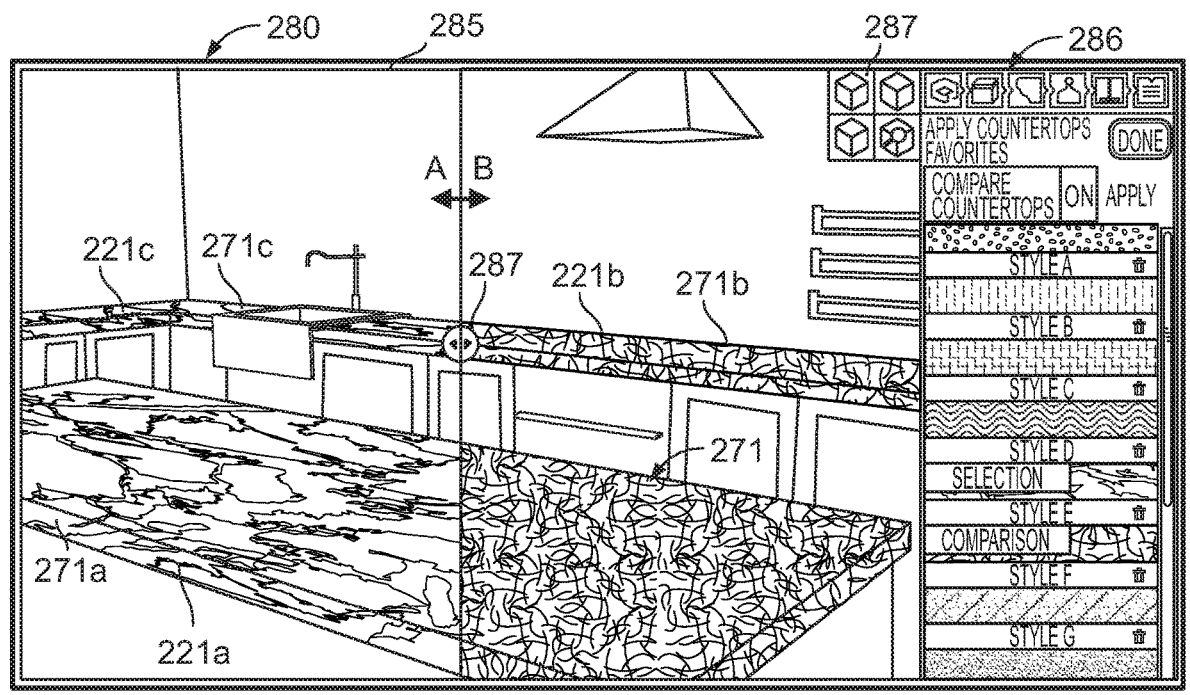
FIG. 3 shows another view of the user interface of the client application of FIG. 2.
Figure 4:
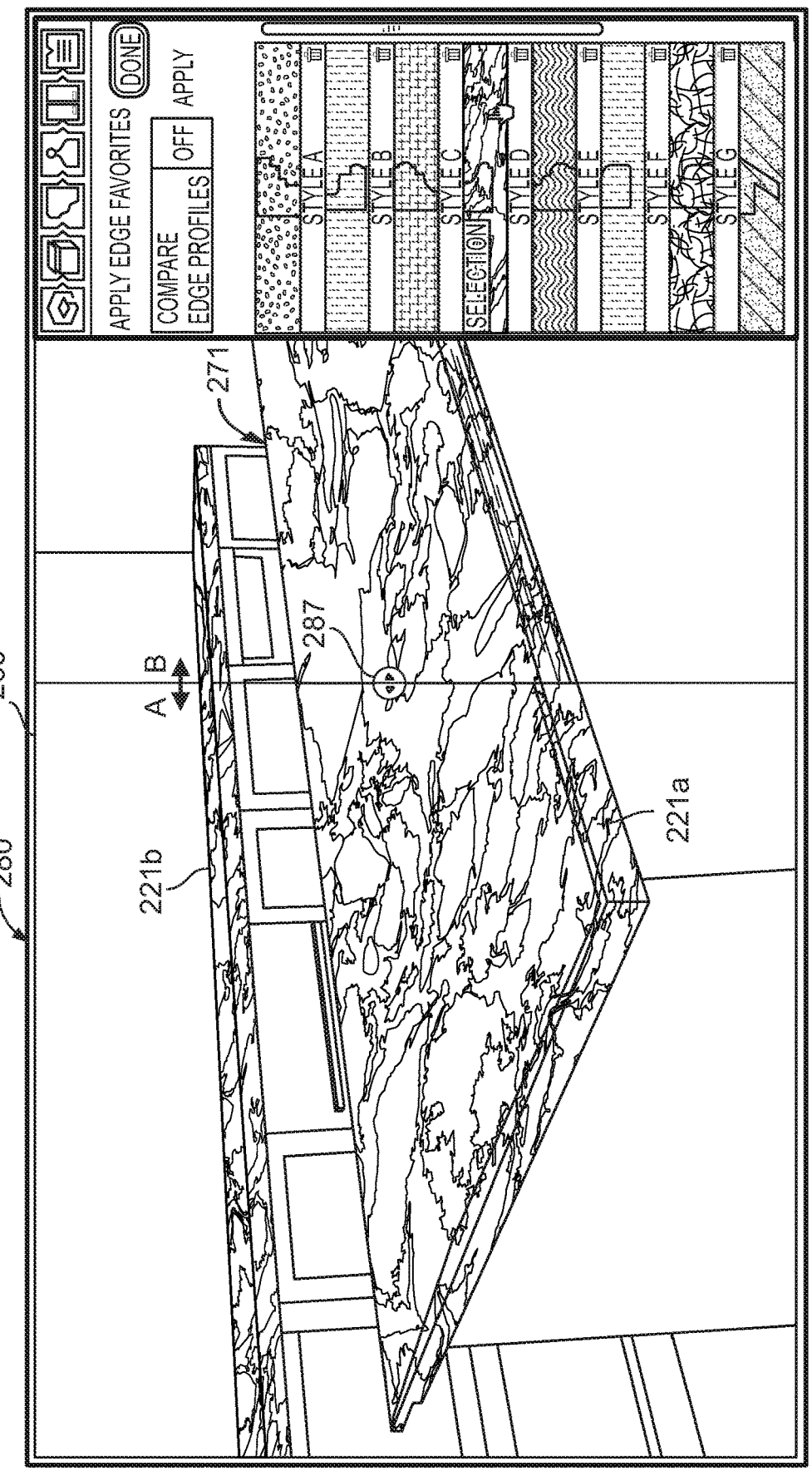
FIG. 4 shows another view of the user interface of the client application of FIG. 2.

Referring to FIGS. 2-4, a user interface 280 of a client application is shown, including a 3D scene 285 generated by system 10 that depicts at least portions of a stone slab 221a, 221b, 221c in an installation environment, and a menu 286 including one or more options for a user to modify 3D scene 285. The generated scene may depict at least portions of surface, such as a major surface of a physical stone slab, available in an inventory of surfaces, such as an inventory of physical stone slabs. User interface 380 allows a user to visualize a specific stone slab or other material that may be installed in the installation environment, and to customize or modify the 3D scene to quickly visualize multiple configurations while reducing physical manipulation of the associated stone slab.

In an exemplary embodiment, the client application may be initialized upon receiving a user initialization input. The client application may then provide a series of user prompts that request information related to generation of a 3D scene. For example, client application may prompt a user to select a slab installation environment from a repository of slab installation environments, including a slab installation environment captured by the user (e.g. the user's kitchen, bathroom, workspace, etc. where a stone slab may be installed), or a preloaded slab installation environment. In some embodiments, client application may request that the user select from one or more slab installation environment styles in order to select a preloaded slab installation environment, such as a "modern," "transitional," or "traditional" style. Upon receiving an input, the client application may output a 3D scene including the selected slab installation environment.

Referring to FIG. 2, 3D scene 285 displayed by client interface 280 is shown, depicting countertop portions 221a, 221b, 221c. User interface menu 286 includes inputs for a user to customize or modify the appearance of 3D scene 285. In an exemplary embodiment, user interface menu 286 includes a plurality of stone slab styles (e.g. "Style A," "Style B," "Style C," etc.) that a user may select to include in the installation environment. To insert a desired slab style into 3D scene 285, a user may select a desired target area 271a, 271b, and/or 271c, followed by the desired stone slab style, or vice versa. Client interface 280 thus can display a 3D scene incorporating more than one slab style in different target areas 271a, 271b, 271c.

In some exemplary embodiments, user interface menu 286 may include inputs for a user to customize the appearance of one or more features and/or architectural details of 3D scene 285. For example, lighting 281, shelving 282, cabinetry 283, and/or other aspects of installation environment 285 (e.g. flooring, wall coverings, fixtures, appliances, etc.) may be selectable by a user to generate a customized visualization of installation environment 285.

User interface menu 285 includes inputs to toggle between predetermined viewing angles or vantage points 287, such as, in some embodiments, a) higher-left b) lower-right, c) close-up edge, and/or d) top-down vantage points. Alternatively or additionally, a viewing angle of 3D scene may be manipulated by clicking or pressing on the 3D scene and dragging to a selected viewing angle.

User interface menu 286 may include features that facilitate efficient and intuitive modification of 3D scene 285. In an exemplary embodiment, client interface 280 includes a stone slab design slider 288. Stone slab design slider 288 is configured to receive input from a user to quickly scroll between a plurality of stone slab designs arranged, for example, from light to dark colors and/or by tone or other attributes. Manipulation of stone slab design slider 288 allows client interface 280 to quickly receive inputs to configure 3D scene 285 with stone slabs having similar designs.

In various exemplary embodiments, each stone slab selectable via stone slab design slider 288 may be preloaded by the client application to reduce latency time between user input selection and the corresponding display in the 3D scene. For example, client application may be configured to display each stone slab selectable via stone slab design slider 288 even during periods in which communication is not available between client device 60 and server system 11, for example. Alternatively or additionally, the client application may communicate a selected stone slab style to server system 11, and receive from server system 11 an updated 3D scene for display by client interface 280. Processing the 3D scene at server system 15 may reduce the processing burden required to operate the client application.

User interface menu 286 may include one or more icons to toggle between various menus, including an environment image menu, edge profile menu, stone slab information menu, comparison view etc. A user may thus navigate through a series of menus and options to modify the 3D scene.

Referring to FIG. 3, user interface 280 of a client application is shown, providing a comparison view in which different stone slabs are depicted at a particular target area 271. For example, user interface 280 facilitates rapid, side-by-side visualization of different stone slabs by a comparison slider 287 movable across the installation environment. Movement of comparison slider 287 in direction 'A' (e.g. to the left in the view of FIG. 3) increases the portion of the scene in which "Style F" is depicted in the target areas, and movement of slider 287 in direction CB' (e.g. to the right in the view of FIG. 3) increases the portion of the scene in which "Style E" is depicted in the target areas. Alternatively or additionally, the comparison view may simultaneously display stone slabs having the same style that correspond to different physical stone slabs in a physical inventory of stone slabs. The comparison view may thus facilitate selection of a specific physical stone slab, in addition to selection of a stone slab style.

Referring to FIG. 4, user interface 280 of a client application is shown, providing a comparison view in which different edge profiles of a stone slab are depicted. For example, user interface 280 facilitates rapid, side-by-side visualization of different edge profiles of a stone slab by a comparison slider 287 movable across the installation environment. Movement of comparison slider 287 in direction 'A' (e.g. to the left in the view of FIG. 4) increases the portion of the scene in which a first edge profile is depicted in the target areas, and movement of slider 287 in direction 'B' (e.g. to the right in the view of FIG. 4) increases the portion of the scene in which a second edge profile is depicted in the target areas. The comparison view may thus facilitate selection of a specific stone slab features or customization options, in addition to selection of a stone slab style.

In an exemplary embodiment, navigation through user interface 280 generates a final installation configuration including a stone slab (e.g. associated with a physical stone slab in an inventory of stone slabs), dimensions of a target area where the stone slab is to be installed, edge profile, and/or other characteristics that can be used to generate a reliable and accurate cost quote. Server system 11 and/or the client application of client device 60 may be programmed with software that identifies a cost associated with each characteristic or combination of characteristics of the installation environment. The costs may be complied to generate a cost quote in real-time that is displayed by client interface 280 while the 3D scene is generated and/or modified. Alternatively or additionally, a cost quote may be generated after an input is received that confirms the final installation configuration.

In some embodiments, client application 280 is programmed with software configured to receive a purchase confirmation of the stone slab depicted in the 3D scene. A stone slab depicted in the 3D scene that is associated with a physical stone slab available in inventory reduces intermediate steps of confirming availability of a stone slab (e.g. by physically manipulating the inventory of stone slabs). System 10 may thus quickly confirm a purchase of a specific stone slab (e.g. in real time). Client device 60 may communicate with server system 11 and production database 30 to assign the stone slab to the customer, such as by updating the metadata of the slab image file and/or otherwise making that particular stone slab unavailable to other purchasers to select. In some exemplary embodiments, a stone slab selected for visualization on a particular client device 60 may be made temporarily unavailable for selection and display on other client devices 60 (e.g. in order to prevent selection of the same stone slab on multiple client devices simultaneously).

Figure 5:
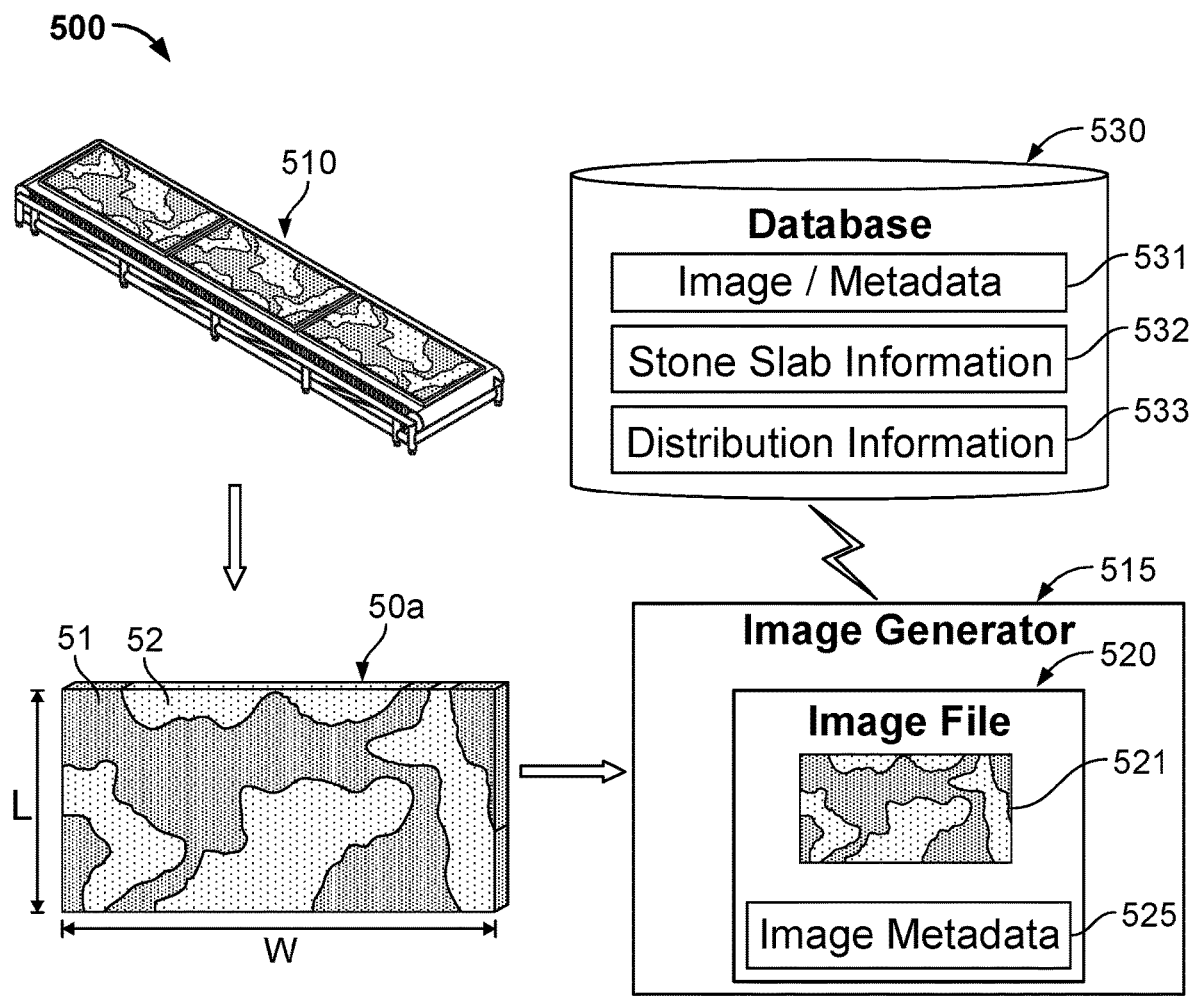
FIG. 5 is a diagram of an exemplary system used in manufacturing, visualizing, and distributing a stone slab in conjunction with, for example, a digital image representation of the stone slab.

Referring to FIG. 5, an exemplary system 500 can be used to produce and/or manage an inventory of one or more stone slabs, such as stone slab 50a, and slab image files 120 associated with each stone slab. In some embodiments, system 500 may be included as part of system 10, and/or image generator 515 and database 530 may have features similar to image generator 15 and production database 30 described above. In this embodiment, system 500 generates a high resolution image of stone slabs 50a such that the images are available for use in one or more subsequent operations throughout the life of the stone slabs.

In an exemplary embodiment, system 500 includes a manufacturing line 510 including one or more stations for manufacturing stone slab 50a. For example, stone slab 50a may be a processed stone slab (e.g. such as a molded stone slab) comprising a quartz material and/or other particulate mineral material that, when mixed with pigments and a resin binder and compressed, provides a hardened slab product suitable for use in living or working spaces (e.g., along a countertop, table, floor, or the like). Manufacturing stone slab 50a may include steps of dispensing one or more particulate mineral mixes in a mold, vibrating and/or compacting the particulate mineral mixes, curing the compacted mix, polishing a major surface, and/or other operations. In other exemplary embodiments, stone slab 50a be may a quarried natural stone slab, and manufacturing line 510 may include one or more cutting, polishing and/or other operations that can be used to manufacture stone slab 50a.

Stone slab 50a may be processed and/or cut to have a length L and a width W, as desired for a particular application. For example, stone slab 50a may be a relatively large slab that may be cut to specific shapes for use in living or working spaces (e.g., along a countertop, table, floor, or the like). In various exemplary embodiments, stone slab 50a is at least 3 feet wide by at least 6 feet long, for example between about 3 feet and 18 feet wide and between about 6 feet and 24 feet long, or between about 4.5 feet and 7 feet wide and between about 10 feet and 12 feet long. In some exemplary embodiments, stone slab 50a is about 7 feet wide by about 12 feet long. In other embodiments, stone slab 50a is about 4.5 feet wide (approximately 140 cm wide) by about 10 feet long (approximately 310 cm long). In some exemplary embodiments, stone slab 50a may have an aesthetic effect including veins 51 and 52 that extend partly or fully across a complete length L of the stone slab 50, through all or part of the thickness T of stone slab 50a, and/or positioned relative to one another based on a predetermined pattern. Such characteristics may provide a natural vein appearance even when the slab is cut and edged to specific shapes.

Stone slab 50a may proceed to an image generator station 515 resulting in a high resolution slab image file 520 of stone slab 50a. In an exemplary embodiment, the image generator station 515 includes a camera (e.g., optionally, a "medium format" camera) mounted within an enclosure. Stone slab 50a may sequentially pass into the enclosure and within the field of view of the camera to be imaged.

In some exemplary embodiments, a slab image file 520 includes a substantially distortion free image 521 and image metadata 525 associated with image 521. In embodiments in which image generator station 515 includes a medium format camera, image 521 may be a medium format image. Also in this exemplary embodiment, the image generator station 515 is present at the same manufacturing location and/or process as an initial stone slab polishing station and/or other manufacturing steps. In some embodiments, the image generator station 515 is positioned after a polishing station in system 500 and prior to storing the slab for an inventory or for distribution to an offsite location. In this way, the high resolution slab image file 520 provides an electronic image 521 of stone slab 50a at the time that stone slab 50a is manufactured. In such embodiments, additional manipulation or physical movement of stone slab 50a can be reduced, and stone slab 50a is able to move through manufacturing line 510, including an image generator station 515, as part of a streamlined system 500. Image 521 and/or other information provided by slab image file 520 may then be used to facilitate and/or automate one or more inventory management, distribution, fabrication or other operations throughout the life of stone slab 50a. In other exemplary embodiments, the image generator station 515 is positioned at a location remote from the manufacturing location (e.g. such that stone slabs are shipped to a different location before being imaged by image generator station 515). For example, image generator station 515 may be at a warehouse, distribution center, or fabrication location where stone slabs are cut or otherwise processed for installation at an end-use location.

In an exemplary embodiment, image 521 provides a high resolution image that allows humanly perceptible characteristics of a physical stone slab 50a to similarly be observed in image 521. In various exemplary embodiments, image 521 may exhibit between about 25 megapixels and 500 megapixels, 30 megapixels and 200 megapixels, or about 40 megapixels. Image 521 may thus be used in addition, and/or as a substitute, to viewing the physical stone slab 50a. Slab image file 520 may be provided as any file or file set including the image 521 and image metadata 525. (As used herein, the term "high resolution image" means a digital image of a slab having a resolution of 25 megapixels or greater. As described in more detail below, other (lower) types of resolution are also contemplated in some embodiments described herein.)

System 500 further includes, in addition to or together with the image generator station 515, a metadata generator station that generates metadata 525 associated with stone slab 50a and/or one or more images of stone slab 50a. For example, the metadata 525 may include information related to stone slab 50a and/or slab image file 520 and may be generated before, after, during, or as part of, an image generator station 515. In various exemplary embodiments, metadata 525 may include information related to image 521 such as a unique identifier associating slab image file 520 with a particular stone slab 50a, manufacturing information such as a date, time and location of manufacture, characteristics of stone slab 50a such as dimensional information, weight, thickness, gloss measurement, roughness measurement, materials, presence and/or location of imperfections, one or more color characteristics, including a color characteristic that may uniquely identify a particular stone slab 50*a*, and/or a dimensional relationship between stone slab 50*a* and the associated image, as described in greater detail herein.

System 500 further includes one or more databases 530 storing information related to system 500. Slab image files 520 associated with stone slabs 50*a* and generated at an image generator station may be stored in database 530 for subsequent access, use, modification and/or distribution. For example, database 530 may include a data storage system made up of one or more repositories that together store information related to system 500. Database 530 may include one or more local databases, for example housed locally at the manufacturing location, and/or may include one or more remote databases.

In an exemplary embodiment, database 530 includes a cloud-based system that may be accessed remotely, and access to various components of database 530 selectively granted to particular users. A manufacturer and/or system administrator may have complete access to all aspects of database 530, while a remote party may be granted access only to particular content, such as particular slab image files 520 the remote party has purchased or is considering purchasing, for example.

In some exemplary embodiments, all or portions of slab image file 520 and/or metadata 525 are stored as read-only data. Such information may be permanently associated with a particular stone slab 50*a*. For example, a unique identifier, manufacturing time, dimensional relationship(s), and/or color characteristics may be stored as read-only data. Other information, such as a purchaser of stone slab 50 and/or other information may be readily updateable throughout the life of slab image file 520, and may be selectable such that certain metadata may be included and/or viewable only by a particular user.

In addition to slab image files 520, database 530 may store other stone slab information 532 and/or distribution information 533 related to one or more remote parties. Such information may similarly be used for one or more operations related to stone slabs 50 and/or selectively distributed to one or more users.

Still referring to FIG. 5, stone slabs, such as stone slab 50*a*, and one or more associated slab image files 520 may subsequently be distributed to a remote party 540. For example, in a distribution operation, particular stone slabs and associated slab image files 520 are assigned to remote party 540. Remote party 540 may be a distributor, fabricator, installer, purchaser of one or more stone slabs, or a prospective purchaser considering purchasing one or more stone slabs. In an exemplary embodiment, remote party 540 is a countertop fabricator that designs, cuts, and/or installs countertops in an end-use application at one or more locations remote from a manufacturing location of stone slab 50*a*. In other exemplary embodiments, remote party 540 may be a distributor, end user, or other member of a distribution chain.

Distribution of slab image files 520 from a location of manufacturing line 510 thus allows remote party 540 to receive stone slabs 50*a* and slab image files 520 independent of one another. One or more stone slabs may be delivered to remote party 540 before, after or simultaneously with associated slab image files 520. For example, in an exemplary distribution operation, slab image files 520 associated with stone slabs assigned to remote party 540 are provided to remote party 540 before stone slabs 50*a* are physically provided to the remote party 540. Remote party 540 may review and/or use slab image files 520 for distribution, modeling, cutting or other operations in a time period that is hours, days or weeks in advance of physically receiving, handling and/or storing the stone slabs. In this way, remote party 540 may begin preparatory operations for a particular installation, for example, at least partly independent of stone slab 50*a*, for example. Upon receipt by remote party 540, stone slab 50*a* may be immediately cut and/or installed at a location of end-use based on plans created using slab image file 520. Storage time and handling by remote party 540 may thus be reduced, facilitating efficiency and reducing an inventory held by remote party 540.

Alternatively or in addition, slab image files 520 may be provided for review by remote party 540 before associated stone slabs are shipped. Remote party 540 may review and confirm or terminate shipment based at least in part, and/or solely, on slab image files 520. In this way, physical handling and other costs associated with denied or returned shipments may be further reduced.

In some exemplary embodiments, one or more associated stone slabs and slab image files 520 may be provided together. For example, slab image files 520 may be physically delivered on a storage device with stone slabs 550. Slab image files 520 can immediately be used by the remote party in stone slab management, cutting, and/or other operations without further need to create an image or other catalog of the received stone slabs at the remote party location. Cost and floor space otherwise required by an image generator station may thus be omitted and dedicated to other stations of remote party 540.

In some exemplary embodiments, slab image files 520 stored in database 530 may be accessed to communicate and/or display selected data from image file 520 without distributing an entire image file 520 itself. For example, server system 11 (FIG. 1) may access image files 520 and communicate an image and/or selected data from image file 520 to client device 60 (FIG. 1). The client device 60 may in turn display the image and/or selected data for viewing by a user. In some embodiments, an image transmitted to client device 60 may be compressed or have lower resolution than an image stored in image file 520. A user may thus quickly view various images associated with an inventory of stone slabs on client device 60 (e.g. remote from server system 11 and/or database 530).

Figure 6:
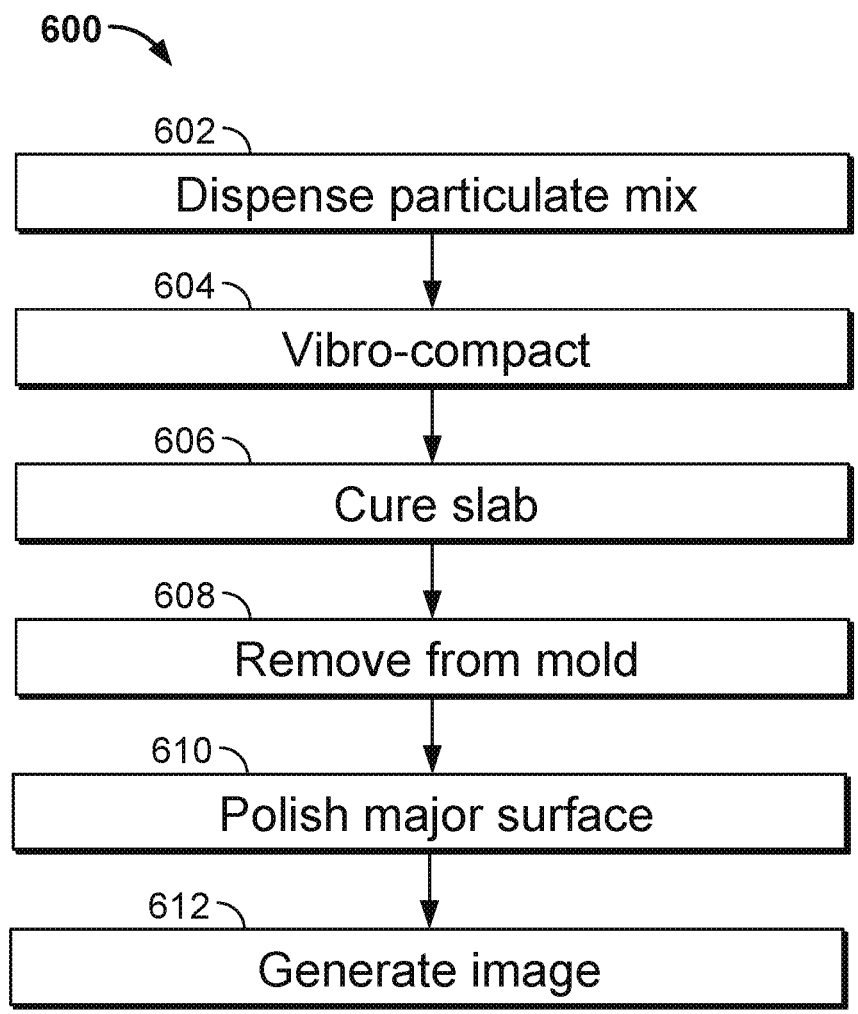
FIG. 6 is a flow diagram of an exemplary process of manufacturing stone slabs and generating image files of the slabs.

Referring to FIG. 6, a flow chart of an exemplary process 600 of manufacturing and managing an inventory of surfaces, such as stone slabs, is shown. In some embodiments, the stone slabs may have features similar to slabs 50*a*, 50*b*, 50*c*, of the inventory of stone slabs 50 described above. The stone slabs may be imaged before distribution from the manufacturing location, as described above with system 500, for example, to generate an image file and metadata including information about an associated stone slab. Alternatively or additionally, the stone slabs may be imaged at a location remote from the manufacturing location, such as at a location where one or more fabrication operations are performed. Each of the stone slabs may include a quartz material and/or other particulate mineral material that, when mixed with pigments and a resin binder and compressed, provides a hardened slab product suitable for use in living or working spaces. In an exemplary embodiment, stone slabs comprise predominantly quartz material.

Exemplary process 600 may include operation 602 of dispensing one or more pigmented particulate mineral mixes into a mold to generate a slab having a desired aesthetic appearance. In some embodiments, one or more of the particulate mineral mixes used to form the stone slabs can include organic polymer(s) and an inorganic (mineral) particulate component. The inorganic (mineral) particulate component may include such components as silicon, basalt, glass, diamond, rocks, pebbles, shells, a variety of quartz containing materials, such as, for example, but not limited to: crushed quartz, sand, quartz particles, and the like, or any combination thereof. In some embodiments, one or more particulate mineral mixes each comprise a quartz material as a predominant component, which may include sand of various particle sizes and of different combinations. In the resulting stone slab, the organic and inorganic materials can be linked using a binder, which may include for example, mono-functional or multifunctional silane molecules, dendrimeric molecules, and the like, that may have the ability to bind the organic and inorganic components of the composite stone mix. The binders may further include a mixture of various components, such as initiators, hardeners, catalysators, binding molecules and bridges, or any combination thereof. Some or all of the mixes dispensed in the mold may include components that are combined in a mixing apparatus (not shown) prior to being conveyed to the mold. The mixing apparatus can be used to blend raw material (such as the quartz material, organic polymers, unsaturated polymers, and the like) at various ratios. For example, some or all of the mixes dispensed in the mold may include about 8-95% quartz aggregates to about 5-15% polymer resins. In addition, various additives, may be added to the raw materials in the mixing apparatus, such additives may include, metallic pieces (e.g., copper flecks or the like), colorants, dyes, pigments, chemical reagents, antimicrobial substances, fungicidal agents, and the like, or any combination thereof.

After the mold has been sufficiently filled in operation 602, the mold may be moved to one or more subsequent operations. For example, exemplary process 600 may include a vibro-compaction press operation 604 during which compaction pressure, vibration, and vacuum may be applied to the contents inside the filled mold, thereby converting the one or more particulate mixes into a rigid slab. After vibro-compaction operation 604, the filled mold (with the compacted and hardened slab therein) may proceed to a curing operation 606 during which the material used to form the slab (including any resin binder material) are cured via a heating or other curing process, thereby further strengthening the slab inside the filled mold. After the slab is fully cured and sufficiently cooled, the hardened and cured slab may be removed from the mold at a mold removal operation 608.

Process 600 may further include a polishing operation 610, during which a major surface of the slab is polished to a smooth finish providing an appearance having, for example, complex striations and veining patterns. In such circumstances, the polished major surface of each of the molded slabs provides an outer appearance that is generally repeatable and similar to the other slabs processed by process 600.

In an exemplary embodiment, process 600 includes an image generator operation 612 that can be used to generate an image associated with each stone slab processed by process 600. Image generating operation 612 may be performed after polishing operation 610 such that a polished slab can readily proceed to image generator operation 612. In an exemplary embodiment, image generating operation 612 generates a high resolution, medium format image associated with each stone slab. As described above, the resulting images may be stored as image files including associated metadata that may be used in inventory management, quality assurance, stone slab selection and matching, and fabrication operations, for example, as described in greater detail herein.

Figure 7:
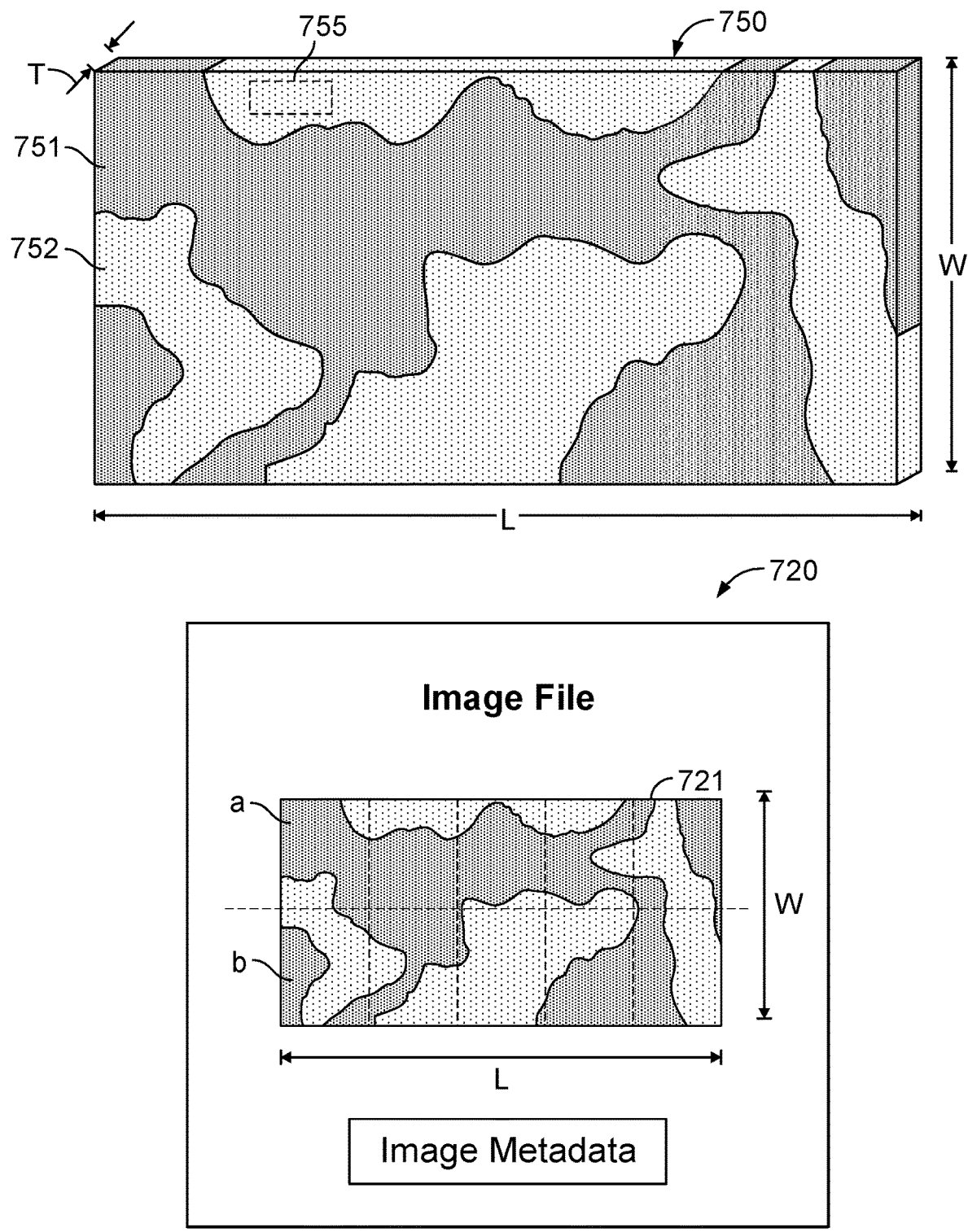
FIG. 7 is a diagram of an exemplary stone slab and associated image file.

Referring to FIG. 7, an exemplary stone slab 750 and associated slab image file 720 are shown. Stone slab 750 may be a processed stone slab, quarried slab or other stone slab 750, and associated slab image file 720 provides a high resolution image 721 and image metadata 725 related to stone slab 750. Stone slab 750 exhibits a variety of features and characteristics, for example resulting from a manufacturing process, and slab image file 720 may include a substantially distortion free, high resolution, medium format image 721 and image metadata related to such features and characteristics.

Similar to systems 10 and 500 described above, image metadata 725 may include data related to stone slab 750 such as, for example, a unique identifier associating slab image file 720 with a particular stone slab 750, time and location of manufacture, dimensional information, weight, presence and/or location of imperfections, one or more color characteristics, and/or other data.

In an exemplary embodiment, image metadata 725 includes a unique identifier that allows association between a particular stone slab 750 and an associated slab image file 720. The unique identifier may include a unique number, code or other identifier that uniquely identifies a single stone slab 750 from one or more other stone slabs 750.

Stone slab 750 is tagged with the unique identifier and/or additional information related to stone slab 750. In an exemplary embodiment, a label 755 is provided on stone slab 750 that includes the unique identifier in a computer-readable and/or human readable format. The label may include a barcode, RFID tag, QR code, etching or writing directly on the stone slab, and/or other identifier. In some exemplary embodiments, the label may be placed on the surface, edge, underside, or inside of the stone slab. In some exemplary embodiments, the label may be an RFID tag that is embedded in the stone slab such that the tag is not visually perceptible (e.g. when stone slab is installed) but may communicate the unique identifier and/or other information when interacted with by an appropriate reader, such as a scanner or RFID tag reader. Alternatively, the unique identifier may be printed on the stone slab, for example on the back of the slab. The unique identifier may be used throughout the life of the associated stone slab to associate the stone slab with an image and/or other information related to stone slab 750.

Still referring to FIG. 7, stone slab 750 and image 721 may exhibit a dimensional relationship such that image 721 and/or metadata 725 provides accurate information related to one or more dimensional characteristics of stone slab 750. In an exemplary embodiment, stone slab 750 exhibits various dimensions including a width W and Length L resulting from a molding and/or cutting operation. Stone slab 750 may also have an aesthetic effect such as veins 751 and 752 that extend partly or fully across a complete length L of stone slab 750 that may be characterized by particular dimensions and spacing. For example, such aesthetic effects may be positioned relative to one another based on a predetermined pattern, and may be similar among a set of stone slabs 750.

Image 721 provides a dimensionally accurate representation of stone slab 750 that both accurately represents relative positioning of edges, veins and/or other features within the slab image, and allows accurate determination of absolute distances between edges and/or such features. Such dimensional accuracy allows image 721 to be used in slab visualization models, selecting and matching operations, and in nesting operations in which stone slab 750 is divided into portions having desired sizes and characteristics for a particular installation. For example, image 721 may be substantially distortion free such that relative positioning of various aesthetic features depicted by image 721 is consistent with stone slab 750.

In an exemplary embodiment, one or more images 721 have a predetermined dimensional relationship with stone slabs 750, such as a consistent ratio of stone slab unit length per image pixel. For example, one or more images 721 may exhibit a ratio of stone slab unit length per image pixel having a desired value. In various exemplary embodiments, a length ratio ($L_{slab}/L_{image}$) of slab length ($L_{slab}$) to image length ($L_{image}$) may be less than 0.02 in. per pixel, less than 0.018 in. per pixel, less than 0.016 in. per pixel, less than 0.014 in. per pixel, less than 0.012 in. per pixel, or less than 0.01 in. per pixel. For example, a length ratio of ($L_{slab}/L_{image}$) may be between 0.005 in. per pixel to 0.02 in. per pixel, 0.01 in. per pixel to 0.018 in. per pixel, or about 0.014 in. per pixel. Such dimensional relationships provide a known relationship (e.g. that can be identified by accessing the metadata stored in the slab image file) and can facilitate a high degree of precision in generating a scene in slab visualization operations, selecting and matching operations, and nesting operations, for example.

In an exemplary embodiment, image 721 is substantially distortion free such that the length ratio ($L_{slab}/L_{image}$) of unit slab length to image length is substantially consistent at any location of image 721. For example, a particular length of image 721 corresponds to a consistent length of stone slab 750, irrespective of whether the length is at a peripheral edge, middle, or other location of image 721. Image 721 thus provides a reliable tool for measuring and cutting stone slab 750. Nesting layouts in which veins, coloring and/or imperfections are intended to be included or avoided in a cut portion or seam, for example, can be prepared using image 721 and reliably applied to stone slab 750. Similarly, image 721 provides a reliable tool for generating a 3D scene that provides a visualization of the associated stone slab in an installation environment. The positioning of veins, coloring and/or imperfections relative to other portions of the slab and/or installation environment can be accurately reproduced in the 3D scene. The 3D scene can thus more accurately represent the visual appearance of the physical stone slab installed in the installation environment.

Furthermore, such dimensional accuracy allows image 721 to be reused through the life of any remaining portion of stone slab 750. For example, after stone slab 750 is cut to remove a portion having a desired size, dimensions of the removed portion and/or remaining slab may be accurately depicted using image 721. Image 721 can thus be reused in subsequent cutting or other operations without a need to generate a new image from the physical partial slab.

In an exemplary embodiment, image metadata 725 includes dimensional information related to stone slab 750 described above. For example, image metadata 725 may include width, length, thickness and/or other dimensions of stone slab 750, width, length, thickness and/or other dimensions of image 721, and/or one or more further dimensional relationships between stone slab 750 and image 721, such as the length ratio ($L_{slab}/L_{image}$) of slab length ($L_{slab}$) to image length ($L_{image}$). Image 721 and image metadata 725 including dimensional information may thus be used together in one or more operations of stone slab 750. A high degree of dimensional accuracy and a predetermined dimensional relationship between image 721 and stone slab 750 allow stone slab to be accurately mapped and cut. Visualization operations in which a 3D scene is created including one or more portions of a stone slab in an installation environment may be performed with limited or no physical reference to stone slab 750. Similarly, subsequent nesting and/or other operations may be performed with limited or no physical reference to stone slab 750.

In various exemplary embodiments, image metadata 725 may include one or more color characteristics related to a color of stone slab 750. For example, image metadata 725 may include a color characteristic including a numeric value representative of one or more of color intensity, uniformity and/or tonality. A color characteristic including a numeric value may be generated using a color measurement and analysis technique. In an exemplary embodiment, a numeric value is generated using L*a*b* values. For example, L*a*b* values may be generated for some or all locations and/or pixels of slab image 721 to provide an indicator of various color characteristics of stone slab 750, including veining, flow, movement, distribution of particulate material, etc. useful in subsequent operations related to stone slab 750.

In an exemplary embodiment, image metadata 725 may include a numeric color characteristic based at least in part on color characteristics associated with one or more regions of slab image 721. For example, slab image 721 may be divided into imaginary regions (such as an array/matrix of regions (a), (b), etc.), and numeric color values generated for each region. Image metadata 725 may thus include one or more location-specific color characteristics, in addition to one or more values representative of an overall color characteristic of stone slab 750.

Alternatively or in addition, image metadata 725 may include one or more numeric color characteristic values, such as a slab color rating, representative of an overall color characteristic of stone slab 750 and/or a combination of local color characteristic values. For example, image metadata 725 may provide a numeric color rating that provides an overall indicator of color and that may be compared to color ratings associated with other stone slabs 750. That is, an exemplary numeric color rating may provide an indicator of how a particular stone slab 750 appears as compared to other stone slabs 750 having a similar style and/or predetermined pattern. Accordingly, a set of stone slabs 750 of a particular style having similar color ratings may be characterized as having a similar visual color appearance, while stone slabs 750 of a particular style having different color ratings may be characterized as exhibiting relatively different visual appearances. In this way, a single numeric color characteristic value included as image metadata 725, alone or in combination with one or more items of information of slab image file 720, may be used to quickly qualify, group, match, and/or select a specific stone slabs 750.

In some embodiments, image metadata 725 may include one or more color characteristic values that are unique to image 471 and/or associated stone slab 750. That is, an exemplary color characteristic may result in a numeric value or array of values representative of color values at one or more locations of stone slab 750 that provides a unique color signature. For example, a unique numeric value may result from compiling color characteristics at various locations of slab image 721 to provide both color information useful in subsequent operations and a numeric value that uniquely identifies stone slab 750 based on color characteristics of that particular stone slab 750.

In various exemplary embodiments, image metadata 725 may include additional information related to an appearance of stone slab 750. For example, image metadata 725 may include one or more defect identifiers providing a location and/or other information regarding one or more defects. Alternatively or in addition, image metadata 725 may include information related to surface properties of stone slab 750, such as information related to surface polish, scratches, gloss, etc. In some exemplary embodiments, image metadata 725 includes gloss values across stone slab 750 that may be used to determine appropriate seam placement.

Figure 8:
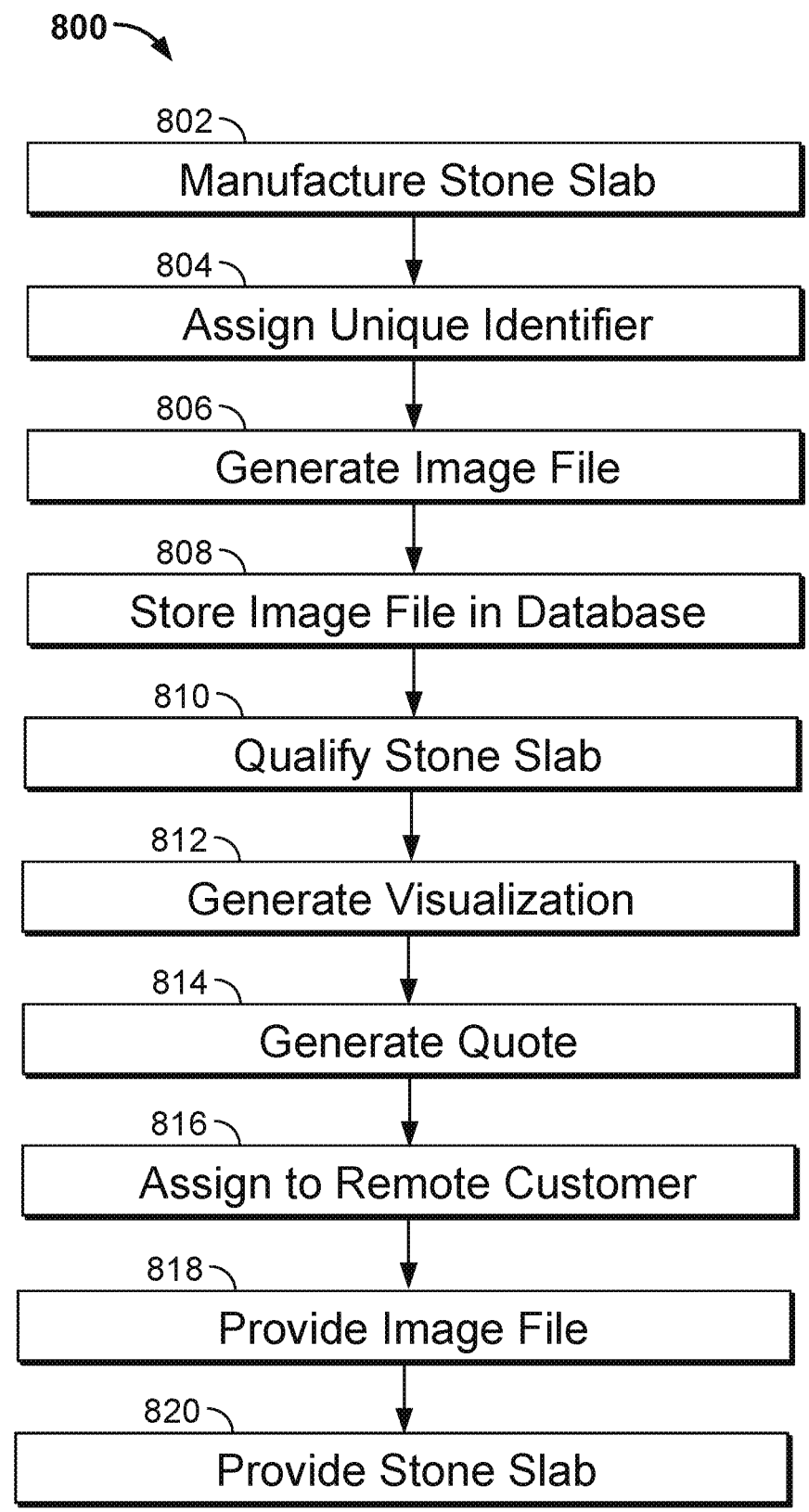
FIG. 8 is a flow diagram of an exemplary process of manufacturing, visualizing, and distributing stone slabs.

Referring now to FIG. 8, a flow diagram of an exemplary process 800 for manufacturing and managing a stone slab is shown, including various operations performed in conjunction with a slab image file associated with the stone slab. In an exemplary embodiment, process 800 first includes operation 802 of manufacturing the stone slab, such as stone slabs 50 described herein. Manufacturing the stone slab may include steps of dispensing one or more particulate mineral mixes in a mold, vibrating and/or compacting the particulate mineral mixes, curing the compacted mix, and/or polishing a major surface of the resulting stone slab. Alternatively, the stone slab may be a quarried natural stone slab that is cut and/or polished during operation 802.

Process 800 further includes operation 804 of assigning a unique identifier associated with the stone slab. The unique identifier may include a unique number, code or other identifier that uniquely identifies a single stone slab from one or more other stone slabs. In some exemplary embodiments, operation 804 of assigning a unique identifier may include tagging the stone slab with the unique identifier, for example by affixing a label, barcode, tag, etching or writing on the stone slab, or other technique.

In an exemplary embodiment, process 800 includes operation 806 of generating a slab image file associated with the stone slab manufactured in manufacturing operation 802. As described herein, operation 806 may include generating a high resolution image, such as a high resolution "medium format" image, for example, of the stone slab and/or generating image metadata including information related to the stone slab and image. In an exemplary embodiment, operation 806 of generating a slab image file is performed at the same location, and in some embodiments, at the same manufacturing line, as operation 802 of manufacturing the stone slab. For example, a stone slab may proceed from a polishing line to an image generator, as described above with reference to systems 100, 500, such that less physical handling and other manipulation is required to position the stone slab for imaging.

Exemplary process 800 further includes operation 808 of storing a slab image file in a database. For example, one or more slab image files generated in operation 806 may be transferred to or otherwise stored in a database for subsequent access, use, modification and/or distribution. Operation 808 may include steps of storing the slab image file to a cloud-based database system and/or grouping the slab image files according to one or more features and characteristics stored as image metadata.

In various exemplary embodiments, operation 806 of generating a slab image file results in an image and image metadata (e.g. unique identifier, manufacturing location and/or date/time, dimensional relationship(s), thickness, gloss readings, color characteristics, purchaser information, processing conditions, genealogy, etc.) associated with a particular stone slab that can streamline and/or automate various subsequent operations before stone slabs are delivered to a remote party. For example, the slab image file may be used in operation 810 of qualifying stone slabs produced during manufacturing operation 802. Qualifying operation 810 may include confirming the absence of defects and/or ensuring features and characteristics of a stone slab are within a predetermined acceptable range using the slab image file generated in operation 806. For example, one or more numeric dimensional, color characteristic and/or other characteristics stored as image metadata may be compared to a predetermined acceptable characteristic value or range of values, and the stone slab qualified and/or sorted for subsequent operations based on the one or more numeric characteristics.

Operation 810 of qualifying a stone slab may further include grouping a stone slab with one or more other stone slabs exhibiting similar features and characteristics. For example, a stone slab having a dimensional, color and/or other characteristic within a particular range may be assigned to a first group of stone slabs, and a stone slab having a color characteristic value within a different range may be assigned to a second group of stone slabs. A slab image file storing the color characteristic value thus allows grouping of stone slabs without extensive human review of either the physical stone slab or an image. Qualifying an inventory of stone slabs into one or more groups having a similar characteristic facilitates efficient management and distribution of stone slabs, as described herein.

In some exemplary embodiments, operation 810 may include grouping one or more stone slabs according to a pre-loaded algorithm. For example, a first stone slab may be grouped as the closest match to a second stone slab based on dimensional, color, and/or other characteristics (e.g. stored as image metadata). Accordingly, a second stone slab may be identified as an alternative or back-up to a first stone slab in the event the first stone slab is lost, damaged, assigned to a different customer, etc. The second stone slab may be readily incorporated into a visualization and/or assigned for delivery to a particular customer (e.g. instead of the first stone slab). Alternatively or additionally, two or more stone slabs may be grouped as compatible for installation together in a single installation environment based on dimensional, color, and/or other characteristics. In some embodiments, gloss values stored as image metadata may be used to group two or more stone slabs compatible for seaming operations.

Exemplary process 800 may further include operation 812 of generating a visualization of a stone slab. Operation 812 may include generating a scene (e.g. a 2D scene, 3D scene, or other virtual reality environment) depicting at least a portion of a major surface of a stone slab associated with the slab image file in a slab installation environment. Operation 812 may be performed at a server system and/or client device, for example, configured with software programmed to receive a slab image stored in the database and/or an image of the slab installation environment, incorporate at least a portion of the stone slab image in the slab installation environment to generate the scene, and transmit the scene to a client device for display.

Process 814 may include operation 814 of generating a cost quote for the stone slab(s) to be delivered, fabricated, and/or installed. Operation 814 of generating a cost quote may include analysis of one or more selections related to the visualization of the installation environment. For example, navigation through a user interface may generate a final installation configuration including a stone slab (e.g. associated with a physical stone slab in an inventory of stone slabs), dimensions of a target area where the stone slab is to be installed, edge profile, and/or other characteristics that can be used to generate a reliable and accurate cost quote. The server system and/or the client application of a client device may be programmed with software that identifies a cost associated with each characteristic and/or combination of characteristics of the installation environment. The costs may be complied to generate a cost quote in real-time that is displayed by the client interface while the scene is generated and/or modified. Alternatively or additionally, a cost quote may be generated after an input is received that confirms the final installation configuration.

Still referring to FIG. 8, process 800 includes operation 816 of assigning one or more stone slabs to a remote party. For example, one or more stone slabs may be assigned as part of a purchasing process. After a user views a visualization generated in operation 812, the associated stone slab may be selected for purchase and assigned to the user. Alternatively or additionally stone slabs may be assigned in preparation of delivery and/or in response to an order placement or other request from a remote party. In an exemplary embodiment, stone slabs are assigned to a remote party at least in part using image metadata of a slab image file. For example, a set of stone slabs may be assigned to the remote party from a set of stone slabs previously grouped based on one or more characteristics stored as image metadata. In some embodiments, the slab image file may be used to identify a stone slab having a similar dimensional, color and/or other characteristic in response to a request for a particular style. Stone slabs having one or more similar characteristics may thus be identified and assigned with little or no human review of the stone slab or image based at least in part on an image and/or metadata generated at the location of manufacturing operation 802.

At operations 818 and 820, slab image files and/or associated stone slabs may be provided to a remote party. Slab image files and stone slabs may be provided to the remote party in any sequence. In an exemplary embodiment, one or more slab image files are provided to a remote party in advance of delivery of associated stone slabs. Accordingly, the remote party may review and/or use the slab image files while the physical stone slab remains in a remote location. Further, the slab image file may allow the remote party to confirm or cancel delivery, begin preparing layouts in a nesting operation, and/or make other decisions regarding associated stone slabs before stone slabs have left a manufacturing or storage facility. Alternatively, or in addition, slab image files and stone slabs may be provided to the remote party substantially simultaneously. When received by the remote party, a fabrication operation, for example, may be initiated immediately by using the associated slab image files, while additional processing steps of inspecting, cataloging, and/or imaging the received stone slabs at the remote party location are reduced.

In some exemplary embodiments, the slab image file is not provided to a remote customer. Layouts for a nesting operation generated during visualization operation 812 may be used to map cuts of the associated physical stone slab, and an additional nesting operation (e.g. using the slab image file) may be omitted.

Operation 818 of providing slab image files to a remote party may include one or more steps of making slab image files available to a remote party. In an exemplary embodiment, providing slab image files to a remote party includes assigning an identifier, such as a customer identifier, lot identifier, order identifier, etc. to one or more slab image files associated with stone slabs to be provided to the remote party. Slab image files associated with the identifier may then be stored in a database or other repository accessible by the remote party to view, download, use and/or otherwise access such slab image files. In this embodiment, slab image files are accessible by a particular remote party, and are not accessible by other remote parties to which the stone slabs are not assigned. Slab image files of the actual stone slabs, rather than merely representative images, are thus made available to the remote party. Alternatively or in addition, associated slab image files may be directly transferred to the remote party, for example by electronic distribution and/or physical delivery of a storage medium containing the one or more slab image files.

Figure 9:
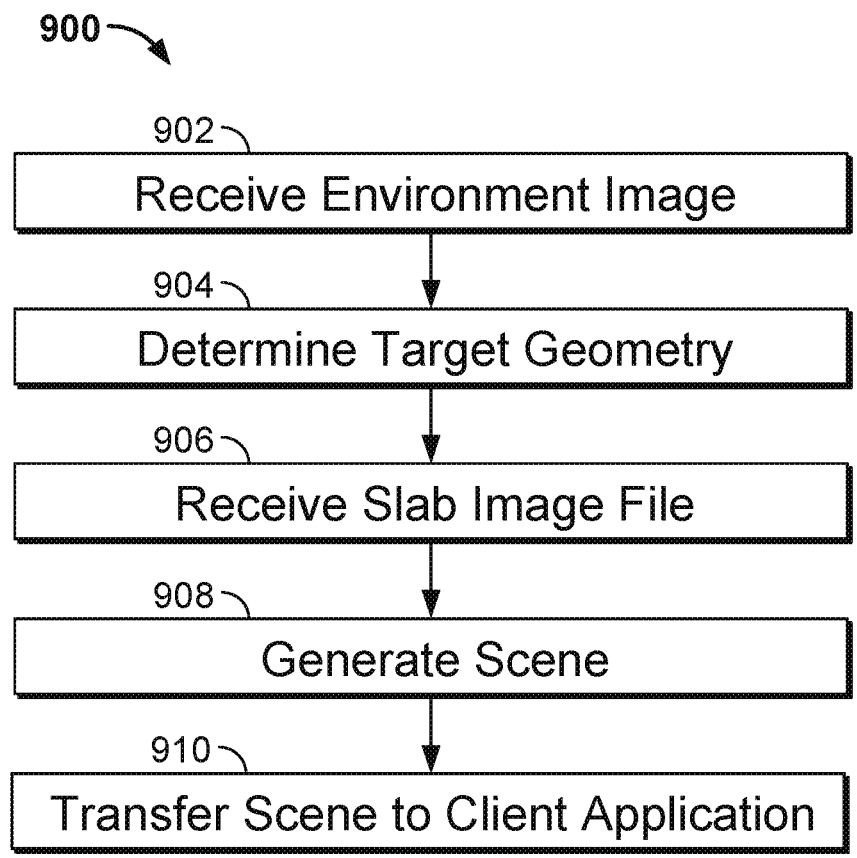
FIG. 9 is a flow diagram of an exemplary process of generating a visualization of a stone slab in an installation environment.

Referring to FIG. 9, a flow diagram of an exemplary process 900 of generating a visualization of a stone slab in an installation environment is shown. Process 900 may be performed partially or entirely by a server system (e.g. server system 11) configured to communicate with a client device (e.g. client device 60). The server system may generate all or particular components of a scene, and transmit the generated components or scene to the client device for display.

Process 900 includes operation 902 of receiving by a server system an environment image of a slab installation environment. The environment image may be an image of a kitchen, bathroom, work area, etc. that includes an area where a stone slab can be installed (e.g., along a countertop, table, floor, or the like). The server system may receive the environment image from the client device, production database, or other repository. In an exemplary embodiment, the environment image depicts an end-use location where a stone slab is to be installed. In other exemplary embodiments, the environment image depicts an environment that has characteristics representative of the type of environment where the physical stone slab may be installed (e.g. a kitchen environment, a bathroom environment, a workspace environment). For example, the environment image may be a pre-loaded environment image having characteristics of the type of environment where the physical stone slab may be installed and/or may be reused by multiple users.

The environment image may include a photo, infrared image, three-dimensional scan, or computer-aided drawing, for example. In some embodiments, the environment image is generated from a three-dimensional scan including visible and infrared imaging. The three-dimensional scan may be analyzed to extract dimensional information related to the installation environment. In some exemplary embodiments, the client device may include a visible light camera, infrared camera 3D scanning device, time-of-flight camera, structured light scanner, stereoscopic scanner, or other image capture device configured to capture an environment image, and/or a communication device configured to transmit the environment image to server system 11.

Process 900 includes operation 904 of determining a geometry of a target area of the slab installation environment where a stone slab may be installed. Operation 904 may include determining a location of the target area (e.g. relative to other components of the slab installation environment outside of the target area), and determining absolute dimensions of the target area. In an exemplary embodiment, the server system may be programmed to identify a target area by recognizing features of the slab installation environment, such as existing countertops. The target area may thus be at least partially defined by an area occupied by existing countertops.

In the server system may be programmed to autonomously determine dimensions of the target area, such as by using photogrammetry techniques. In some embodiments, the environment image received by the server system may include dimensional data from which the geometry of the target area may be readily calculated. Alternatively or additionally, a target area may be manually selected using a user interface in communication with the server system, such as by manually selecting a feature of the environment image (e.g. such as existing countertops), drawing a box around a target area, or otherwise manually designating an area of the environment image as a target area. Dimensions of the selected target area may then be extracted by the server system.

Process 900 further includes operation 906 of receiving a slab image file. In an exemplary embodiment, slab image file may be similar to slab image files 20, 520, 720, described above, and include an image of a physical stone slab stored in an inventory of stone slabs and image metadata associated with the stone slab. The server system may receive the stone slab image file from a production database (e.g. production database 30), client device (e.g. client device 60), or another repository of slab image files. In an exemplary embodiment, operation 906 may include identifying a slab image file based on characteristics stored as metadata in the slab image file (e.g. based on a particular slab style, manufacture date, dimensions, color characteristics, movement, edge profile, gloss, or other characteristics). The desired characteristics may be selected manually and/or according to preprogrammed instructions. For example, the system may receive input from a user including a requested slab characteristic, and subsequently identify slab image files having the requested characteristics. Alternatively or additionally, the system may identify slab image files compatible with the target area identified in the environment image according to preprogrammed instructions. For example, a slab image file may be selected based on particular color characteristics that are compatible with color characteristics of the environment image. Similarly, a slab image file may be selected based on the dimensions of the target area. A slab image file may be selected such that the number of cuts required to fabricate countertops that fit the target area is reduced, or to match a previously cut slab with a target area having similar dimensions to reduce waste. In various embodiments, a slab image file may be requested by the server system, and/or may be transmitted to the server system based on instructions originating from a client device.

In various exemplary embodiments, multiple slab image files may be selected for possible use in a subsequent visualization operation. For example, multiple slab image files associated with slabs having similar visual appearances may be selected (e.g. based on user input and/or according to a pre-loaded algorithm). A first slab image file may be a primary image file for visualization in an installation environment, and a second slab image file may be a secondary image file for visualization in an installation environment. The primary and second image files may thus provide alternative image files that may be selected (e.g. based on the generated visualization). Alternatively or in addition, the secondary image file may provide a back-up in the event the stone slab associated with the primary image file becomes lost or damaged.

In an exemplary embodiment, process 900 may include operation 908 of generating a scene depicting at least a portion of the major surface of the stone slab associated with the slab image file at the target area in the slab installation environment. Operation 908 may include executing rendering software programmed to combine at least a portion of the stone slab image (e.g. depicting a major face of the stone slab) with the slab installation environment. In this way, a generated scene can provide a user with a realistic visualization of a particular stone slab in an installation environment. In some embodiments, the generated scene can provide an accurate indication of the visual appearance of a stone slab when installed, while reducing physical manipulation and difficulty that may be associated with viewing the physical stone slab itself. Further, in embodiments in which the scene is generated using a slab image file associated with a physical stone slab and an environment image of the intended slab installation environment (e.g. a customer's kitchen, bathroom, workplace, etc.), the visualization may help a customer by providing a preview (i.e., before purchasing and/or installing the stone slab) of the visual appearance of the physical stone slab installed in the user environment.

In many embodiments, operation 908 includes dividing the slab image into smaller slab image portions having dimensions that match the target area of the slab installation environment. For example, the server system may include software programmed to divide the stone slab image into portions having dimensions based on the target area. A substantially distortion free, high resolution image and dimensional characteristics stored as image file metadata may promote reliability and accuracy in dividing the slab image into portions that precisely fit the target area. Furthermore, the operation of dividing the slab image into smaller portions to match the target area can be useful in subsequent fabrication operations. For example, the identified geometry of slab image portions (e.g. relative to the overall dimensions of the slab image) can be used during a subsequent fabrication operation to reliably and accurately map and cut the associated physical stone slab. Operation 908 may thus generate a slab layout that is dimensionally accurate such that the slab layout is useful both in slab visualization operations and in subsequent fabrication operations of the physical stone slab.

Operation 908 may include generating visible edges of the slab(s) installed in the installation environment. In scenarios in which the slab image must be divided to generate image portions that have dimensions based on dimensions of the target area, edges can be rendered so that the thickness of the slab is visible and accurately depicts visual features extending through the thickness.

Operation 910 includes transferring the scene to a client application for display of the scene by a client device. For example, the scene may be transferred to the client application via a network communication device. In various exemplary embodiments, the scene may be completely or partially generated at the server system such that processing burden on the client device is reduced. In some embodiments, the scene may include several components that can be assembled or otherwise utilized by the client application to display the generated scene.

Figure 10:
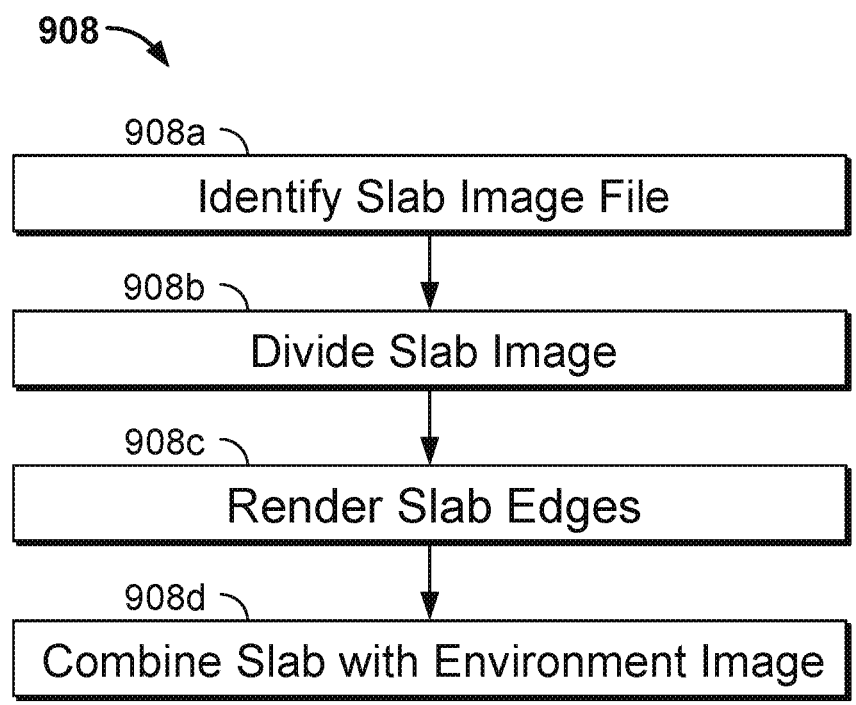
FIG. 10 flow diagram of an exemplary process 908 of generating a scene of a stone slab visualization.

Referring to FIG. 10, a flow diagram of an exemplary process 908 of generating a visualization of a stone slab in an installation environment is shown. Process 908 may be performed partially or entirely by a server system (e.g. server system 11) configured to communicate with a client device (e.g. client device 60). The server system may generate all or particular components of a scene, and transmit the generated components or scene to the client device for display. Alternatively or additionally, process 908 may be performed partially or entirely by a client device.

Process 908 includes operation 908*a* of identifying a slab image file for use in a slab visualization. In some embodiments, operation 908*a* may be similar to the operation of identifying a slab image file described above with reference to operation 906. Operation 908*a* may include identifying a slab image file based on characteristics of the associated stone slab, such as characteristics stored as metadata in the slab image file. For example, an image file may be identified by searching the database of slab image files using image file metadata based on criteria of a particular slab style, dimensions, color characteristics, movement, edge profile, gloss, and/or other characteristics.

Operation 908*a* may include receiving manual input from a user of selected characteristics. For example, a user may select a desired slab style from a menu of available slab styles. The server system may be configured with software programmed to receive the user input and identify slab image files associated with the selected slab style from the database. Alternatively or additionally, a user may select a desired slab dimension, color characteristics, movement, edge profile, gloss, and/or other characteristics.

Operation 908*a* may be at least partially automated. In some embodiments, the server system may be configured with software programmed to identify a particular slab image file based partially on manual input received from a client device and partially accordingly to preprogrammed instructions. For example, the server system may identify a particular stone slab image file from a group of slab image files identified based on the characteristics received from the client device. In one embodiment, a particular stone slab image file may be selected based on a manufacture date, color characteristics, movement, edge profile, gloss, or other characteristics. In other embodiments, the first slab image file identified as having the characteristics input by the user may be selected for use.

In some embodiments, operation 908*a* may include identifying a slab image file compatible with a target area identified in the environment image. A slab image file may be selected based on particular color characteristics that are compatible with color characteristics of the environment image. Similarly, a slab image file may be selected based on dimensions of the target area. For example, a slab image file may be selected based on dimensions of the target area so as to reduce the number of cuts required to fabricate countertops that fit the target area, or so that a previously cut slab may be used, reducing wasted material (e.g. a small slab may be selected for use with a small target area, thus identifying a slab for installation that may have otherwise been discarded).

In some embodiments, operation 908*a* includes identifying a slab image file at least partially based on preprogrammed instructions in a manner that reduces the processing burden of the system. For example, the server system may include software programmed to compare various characteristics stored in the image file metadata according to a predetermined sequence. In one embodiment, slab image files having a particular style are first identified, followed by one or more of a particular dimension, color characteristics, etc.

In an exemplary embodiment, process 908 includes operation 908*b* of dividing the slab image into image portions compatible with the target area of the slab installation environment. The slab image of the slab image file (and the associated physical stone slab) have dimensions that may differ from dimensions of the target area of the slab installation environment. For example, the slab may have a rectangular shape with standard dimensions, such as a length of 12 feet and a width of 4.5 feet, or may have relatively smaller dimensions in scenarios in which the slab is a portion of a slab (e.g. that has been previously cut). The server system may include software programmed to divide the stone slab image to generate portions having dimensions based on the target area. A substantially distortion free, high resolution image, and dimensional characteristics stored as image file metadata, promote reliability and accuracy in dividing the slab image into portions that precisely fit the target area, and that accurately represent cuts that can be made to the physical stone slab during subsequent fabrication operations.

Operation 908*b* may include generating slab image portions according to an algorithm or set of rules that produces an aesthetically pleasing configuration of the slab portions in the target area of the slab installation environment, while reducing processing power required to complete the operation. For example, the slab image may be divided based on the presence and locations of aesthetic characteristics, such as veins, surface defects, gloss levels of the major surface, color movement, etc. The slab image portions may be oriented so that veins extend in an aesthetically pleasing direction, such as parallel or perpendicular to a direction of the longest dimension of the target area. In some embodiments, the slab image may be divided based on gloss values stored for locations across the major face of the slab. For example, the slab image can be divided so that gloss values are similar at locations adjacent to seams (e.g. between slab image portions when the slab image portions are inserted at the target area of the environment image). Alternatively or additionally, the slab image may be divided based on a preprogrammed algorithm configured to reduce the number of cuts that would be required to similarly divide the associated physical stone slab, and/or to reduce waste by maximizing the size of leftover portions that are not applied to the target area of the slab installation environment.

In some exemplary embodiments, operation 908*b* may generate slab image portions according to user input associated with an orientation or positioning of the slab. For example, a user may select a particular orientation of a stone slab relative to the target area (e.g. such that a vein or other feature has a selected orientation relative to the installation environment). Alternatively or additionally, a user may select a particular positioning of the stone slab relative to a target area (e.g. such that a vein or other feature has a selected positioning relative to the installation environment). In some embodiments, a user may input by dragging a simulated stone slab image into a desired positioning on a target area. Operation 908*b* may divide the slab image to generate slab image portions matched to the target area in the selected orientation and/or positioning.

Operation 908*b* of dividing the slab image into smaller portions to match the target area of the slab installation environment can be useful in subsequent fabrication operations. For example, the dimensions and locations of the slab image portions (e.g. relative to the overall dimensions of the slab image) can be reused during a subsequent fabrication operation to reliably and accurately cut the associated physical stone slab. Operation 908 may thus generate a slab layout that is useful both in generating the scene for visualization and in subsequent fabrication of the physical stone slab.

Process 908 may include operation 908*c* of rendering edges of the slab image portions. In scenarios in which the slab image must be divided to generate image portions that match the target area, the slab image file may not include an image of edges of the slab because the physical stone slab has not yet been cut. In an exemplary embodiment, edges are rendered to accurately depict an aesthetic appearance of the thickness of the stone slab. Veins visible on the major surface may be rendered as extending through the entire thickness of the slab image portion, and edges may be rendered with a predetermined profile, which may be selected by a user, for example. In some exemplary embodiments, server system may render a single edge profile that can be subsequently modified (e.g. via a client application). Alternatively or additionally, server system may render a plurality of slab image portion/edge profile combinations that a user can subsequently select from or toggle between (e.g. via a client application). Alternatively, the server system may render an edge profile for each design.

Operation 908b further includes combining the slab image portion(s) with the environment image to generate a scene (e.g. a 3D scene) depicting at least a portion of a major surface of the stone slab associated with the slab image file at the target areas in the slab installation environment. In some embodiments, operation 908b, results in a scene that depicts at least portions of a stone slab that is available in an inventory of stone slabs, and provides a reliable and accurate installation visualization. In this way, a scene generated according to some exemplary embodiments described herein provides not only an accurate visualization of a particular style of stone slab in an installation environment, but can also provide an accurate visualization of a specific stone slab. The aesthetic characteristics of the specific stone slab, such as the positioning of veins or other visual appearances (e.g. that may vary slightly even between slabs having the same style), are accurately depicted in the installation environment, and may be adjusted by the user.

In an exemplary embodiment, the slab image portions are combined with the environment image such that at least the major surfaces of the slab image portions are depicted in a non-repeating and non-tiling manner. For example, no portion of the major surface from the slab image is repeated or distorted in the generated scene. The slab image portions depicted in the scene thus represent a configuration of physical stone slabs that could be applied to target areas in the physical installation environment. The slab image portions may thus have dimensions and edges that accurately reflect dimensions and edges that could result from physically cutting and finishing the associated physical stone slab.

Figure 11:
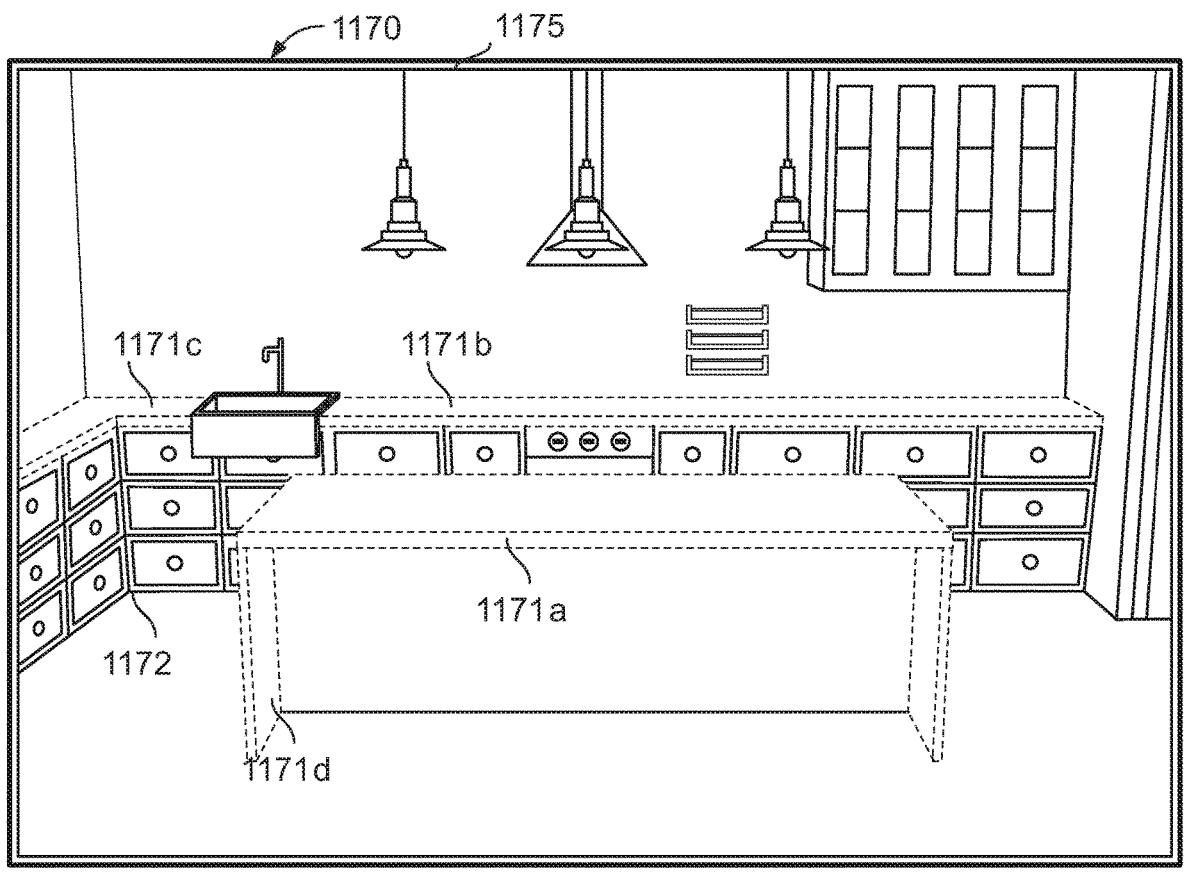
FIG. 11 shows an environment image of an installation environment.

Referring now to FIG. 11, an environment image 1175 of a slab installation environment 1170 is shown. Slab installation environment 1170 is a kitchen including one or more target areas 1171 where work surfaces or countertops may be present or may be subsequently installed. Installation environment 1170 includes multiple target areas, 1171a, 1171b, 1171c, 1171d. For example, target area 1171a may be an area of a kitchen island countertop, and target areas 1171b, 1171c may be countertops associated with cabinetry and/or positioned adjacent to vertical walls of slab installation environment 1170.

Target areas 1171 may have any selected orientation including horizontal, vertical, and/or slanted surfaces. In some exemplary embodiments, target area 1171 includes vertically oriented target areas 1171d. For example, target area 1171d may designate a surface that provides a "waterfall effect" and/or may extend between a floor and target area 1171a.

An exemplary post-production system, such as post-production system 10, includes software programmed to identify target areas of environment image 1175 where a stone slab may be installed. System may include software programmed to recognize features of the slab installation environment associated with a target area. In an exemplary embodiment, system 10 is programmed to recognize and identify target areas 1171a, 1171b, 1171c, 1171d where a stone slab may be installed based on the presence of existing countertops, the shape and/or configuration of cabinetry 1172, or other characteristics of environment image 1170. Alternatively or additionally, target areas 1171a, 1171b, 1171c, 1171d of the environment image 1170 may be manually identified via manual user input at client device 60 (e.g. while client device displays environment image 1170), such as by manually selecting an area of environment image 1170, drawing a box around an area, or otherwise manually designating an area of environment image 1170 as a target area. In an exemplary embodiment, system 10 identifies proposed target areas 1171a, 1171b, 1171c, 1171d displays the proposed target areas 1171a, 1171b, 1171c, 1171d to a user via a client device (e.g. by designating an area on broken lines, ghosting, etc.), and receives input from a user confirming or canceling selection of one or more of target areas 1171a, 1171b, 1171c, 1171d.

System 10 further includes software programmed to determine a geometry of the selected target areas 1171a, 1171b, 1171c. For example, system 10 is configured with software to determine a location of the target areas 1171a, 1171b, 1171c relative to other components of the installation environment, and to determine absolute dimensions of the target areas 1171a, 1171b, 1171c. In some embodiments, the environment image 1170 may include dimensional data from which the geometry of the target area may be calculated when received by system 10. Alternatively or additionally, absolute dimensions may be determined using photogrammetry techniques, for example.

Figure 12:
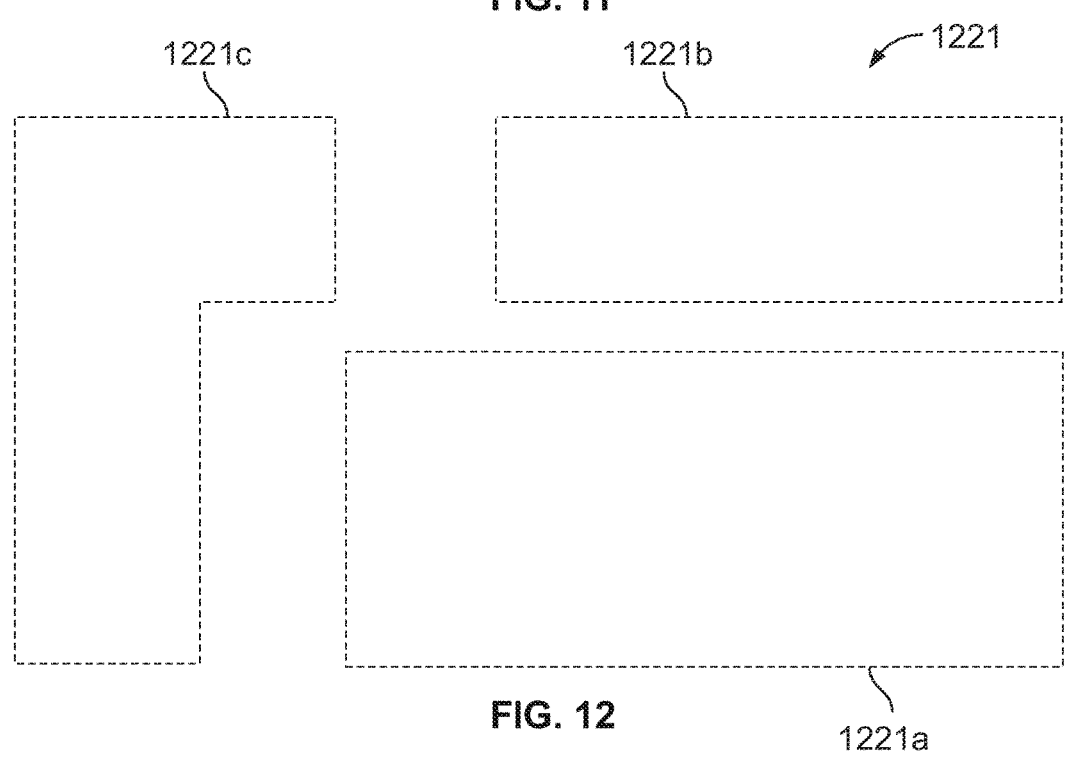
FIG. 12 shows a plan view of major surfaces of an exemplary slab image divided into slab image portions.

Referring to FIG. 12, a plan view of major surfaces of an exemplary slab image 1221 divided into slab image portions 1221a, 1221b, 1221c is shown. System 10 includes software programmed to divide the slab image 1221 into slab image portions 1221a, 1221b, 1221c having dimensions that correspond to the dimensions of target areas 1171a, 1171b, 1171c (FIG. 11). In this way, slab image 1221 can be divided into image portions that can be visualized in the target areas while maintaining dimensional accuracy and without repeating or tiling portions of slab image 1221.

System 10 may include software programmed to divide slab image 1221 into slab image portions 1221a, 1221b, 1221c in a manner that produces an aesthetically pleasing configuration of the slab images portions 1221a, 1221b, 1221c, in target areas 1171a, 1171b, 1171c of the installation environment, while reducing processing power required to complete the operation. For example, slab image 1221 may be divided based on the presence and locations of aesthetic characteristics, such as veins, surface defects, gloss levels of the major surface, color movement, etc. Slab image portions may be oriented so that veins extend in an aesthetically pleasing direction, such as parallel or perpendicular to a longitudinal direction of the cabinetry, for example. In some embodiments, slab image 1221 may be divided based on gloss values stored for locations across the major face of the slab. For example, slab image 1221 may be divided so that gloss values are consistent adjacent to seams between slab image portions when the slab image portions are inserted at the target area of the environment image. Alternatively or additionally, slab image 1221 may be divided based on a preprogrammed algorithm configured to reduce the number of cuts that would be required to similarly divide the associated physical stone slab, and/or to reduce waste by maximizing the size of leftover portions (not shown in FIG. 12) that are not applied to the target area of the slab installation environment. In some embodiments, the target area may have the same geometry as the major surface of the stone slab (e.g. and slab image 1221) such that slab image 1221 can be applied to the target area without dividing into slab image portions. Alternatively, the target area may have the same geometry as the major surface of the stone slab In an exemplary embodiment, system 10 may be configured to update an image file including slab image 1221 to include dimensional information related to image portions 1221a, 1221b, 1221c. The dimensions and locations of the slab image portions (e.g. relative to the overall dimensions of the slab image) can be used during a subsequent fabrication operation to reliably and accurately cut the associated physical stone slab.

While this specification contains many specific implementation details, these should not be construed as limitations on the scope of any technology described herein or of what may be claimed, but rather as descriptions of features that may be specific to particular embodiments. Certain features that are described in this specification in the context of separate embodiments can also be implemented in combination in a single embodiment in part or in whole. Conversely, various features that are described in the context of a single embodiment can also be implemented in multiple embodiments separately or in any subcombination. Moreover, although features may be described herein as acting in certain combinations and/or initially claimed as such, one or more features from a claimed combination can in some cases be excised separate from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Although a number of implementations have been described in detail above, other modifications are possible. For example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for producing stone slabs, comprising:
storing slab image files at a production database of a server system, the slab image files associated with a physical inventory of stone slabs, each slab image file associated with a single stone slab in the physical inventory and including an image of a major surface of the single stone slab, each slab image file comprising image metadata including at least one dimensional characteristic of the single stone slab;
generating a 3D scene depicting at least a portion of the major surface of a single stone slab associated with a slab image file in a slab installation environment, the slab image file selected based on a characteristic of the stone slab stored as image metadata in the slab image file; and
transferring the 3D scene to a client application for display of the 3D scene at a client device.

2. The method of claim 1, wherein the characteristic comprises a slab style.

3. The method of claim 2, wherein the slab image file is further selected based on a color characteristic.

4. The method of claim 3, wherein the color characteristic comprises a numeric color rating.

5. The method of claim 1, wherein the characteristic comprises a movement characteristic.

6. The method of claim 1, wherein the characteristic comprises a gloss characteristic.

7. The method of claim 1, wherein the slab image file is selected by matching a color characteristic of a second slab image file.

8. The method of claim 7, wherein generating a 3D scene comprises depicting at least a portion of a second major surface of a second single stone slab associated with the second slab image file in the slab installation environment.

9. The method of claim 1, wherein the slab image file is selected based on compatibility with a color characteristic of the slab installation environment.

10. The method of claim 1, further comprising determining at least one geometry of a target area of the slab installation environment, wherein the target area has a different geometry than the major surface of the stone slab.

11. The method of claim 8, wherein the slab image file is selected based on compatibility with a type of the target area.

12. The method of claim 9, wherein the target area type is selected from the group consisting of countertop, backsplash, flooring, and wall covering.

13. The method of claim 1, wherein storing slab image files comprises storing slab image files such that the slab image files are searchable by a color characteristic and a gloss characteristic.

14. The method of claim 1, wherein the 3D scene includes all or one or more portions of the major surface of the single stone slab without repeating any portion of the major surface of the single stone slab.

15. The method of claim 14, wherein the slab image files are generated at a stone slab manufacturing site.

16. The method of claim 1, wherein the client application is configured to receive user inputs to customize characteristics of the single stone slab in the 3D scene.

17. The method of claim 16, wherein the customized characteristics are selected from the group consisting of edge style, stone slab orientation, and stone slab position.

18. A system for producing stone slabs, comprising:
a production database stored at a server system and including slab image files associated with a physical inventory of stone slabs, each slab image file associated with only a single stone slab in the physical inventory of stone slabs and including an image of a major surface of the single stone slab, each slab image file comprising image metadata including at least one dimensional characteristic of the single stone slab;
the server system including software programmed to receive a slab image file from the production database, the slab image file selected based on a characteristic of the stone slab stored as image metadata in the slab image file, and generate a scene depicting at least a portion of the major surface of the stone slab associated with the slab image file at a target area in a slab installation environment; and
the server system including a network communication device to transfer the scene to a client application for display of the scene at a client device;
wherein the target area has a different geometry than the major surface of the single stone slab.

19. The system of claim 18, wherein the software is further programmed to receive an environment image of the slab installation environment, and programmed to determine a geometry of a target area of the slab installation environment.

20. The system of claim 19, wherein the slab image file is selected based on slab style and an additional characteristic of the slab image file stored as metadata, the additional characteristic selected from the group consisting of a color characteristic and gloss characteristic.

* * * * *